(12) United States Patent
Yeh et al.

(10) Patent No.: US 11,915,991 B2
(45) Date of Patent: Feb. 27, 2024

(54) SEMICONDUCTOR DEVICE HAVING FIRST HEAT SPREADER AND SECOND HEAT SPREADER AND MANUFACTURING METHOD THEREOF

(71) Applicant: Taiwan Semiconductor Manufacturing Company, Ltd., Hsinchu (TW)

(72) Inventors: Shu-Shen Yeh, Taoyuan (TW); Po-Yao Lin, Hsinchu County (TW); Yu-Sheng Lin, Hsinchu (TW); Po-Chen Lai, Hsinchu County (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 4 days.

(21) Appl. No.: 17/362,905

(22) Filed: Jun. 29, 2021

(65) Prior Publication Data
US 2022/0310474 A1    Sep. 29, 2022

Related U.S. Application Data

(60) Provisional application No. 63/166,251, filed on Mar. 26, 2021.

(51) Int. Cl.
*H01L 23/367* (2006.01)
*H01L 23/538* (2006.01)
(Continued)

(52) U.S. Cl.
CPC ........ *H01L 23/3675* (2013.01); *H01L 21/568* (2013.01); *H01L 23/3185* (2013.01);
(Continued)

(58) Field of Classification Search
CPC ... H01L 21/563; H01L 21/4882; H01L 23/36; H01L 23/40; H01L 23/42; H01L 23/50;
(Continued)

(56) References Cited

U.S. PATENT DOCUMENTS 8,350,263 B2 *  1/2013  Oda ........................ H01L 24/92
                                                     257/713
8,674,499 B2 *  3/2014  Murayama ................ F28F 7/00
                                                     257/706

(Continued)

FOREIGN PATENT DOCUMENTS

TW          202027177           7/2020

OTHER PUBLICATIONS

"Office Action of Taiwan Counterpart Application", dated Mar. 22, 2022, p. 1-p. 4.

Primary Examiner — Khiem D Nguyen
(74) Attorney, Agent, or Firm — JCIPRNET

(57) ABSTRACT

A semiconductor device includes a substrate, a package structure, a first heat spreader, and a second heat spreader. The package structure is disposed on the substrate. The first heat spreader is disposed on the substrate. The first heat spreader surrounds the package structure. The second heat spreader is disposed on the package structure. The second heat spreader is connected to the first heat spreader. A material of the first heat spreader is different from a material of the second heat spreader.

20 Claims, 23 Drawing Sheets

(51) Int. Cl.
*H01L 23/31* (2006.01)
*H01L 23/00* (2006.01)
*H01L 21/56* (2006.01)
*H01L 25/065* (2023.01)

(52) U.S. Cl.
CPC .......... *H01L 23/5389* (2013.01); *H01L 24/33* (2013.01); *H01L 24/81* (2013.01); *H01L 24/83* (2013.01); *H01L 25/0655* (2013.01); *H01L 24/05* (2013.01); *H01L 24/16* (2013.01); *H01L 24/73* (2013.01); *H01L 2224/0557* (2013.01); *H01L 2224/16227* (2013.01); *H01L 2224/33181* (2013.01); *H01L 2224/73204* (2013.01); *H01L 2224/73253* (2013.01); *H01L 2924/15311* (2013.01); *H01L 2924/1811* (2013.01)

(58) Field of Classification Search
CPC . H01L 23/3128; H01L 23/433; H01L 23/367; H01L 23/3672; H01L 23/3677; H01L 23/373; H01L 23/3736; H01L 23/49811; H01L 23/5383; H01L 23/5384; H01L 23/3185; H01L 23/3675; H01L 23/5389; H01L 24/05; H01L 24/16; H01L 24/33; H01L 24/73; H01L 24/81; H01L 24/83; H01L 2023/4043; H01L 2023/405; H01L 23/10
USPC .......................................... 257/712, 717, 718
See application file for complete search history.

(56) References Cited

U.S. PATENT DOCUMENTS

| | | | |
|---|---|---|---|
| 8,704,341 B2 | 4/2014 | Lin et al. | |
| 8,993,380 B2 | 3/2015 | Hou et al. | |
| 9,257,364 B2 | 2/2016 | Ahuja et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 9,953,935 B2* | 4/2018 | Li | H01L 23/055 |
| 2004/0036172 A1* | 2/2004 | Azuma | H01L 23/3128 257/E23.092 |
| 2006/0043581 A1* | 3/2006 | Prokofiev | H01L 23/49838 257/691 |
| 2007/0004083 A1* | 1/2007 | Chiu | H01L 23/562 438/106 |
| 2007/0097650 A1* | 5/2007 | Fitzgerald | H01L 23/42 257/E23.087 |
| 2010/0230805 A1* | 9/2010 | Refai-Ahmed | H01L 23/36 438/107 |
| 2014/0367847 A1* | 12/2014 | Strader | H01L 23/3672 438/122 |
| 2015/0035135 A1* | 2/2015 | Hung | H01L 23/3672 257/712 |
| 2015/0076680 A1 | 3/2015 | Ibrahim et al. | |
| 2015/0194364 A1* | 7/2015 | Lamorey | H01L 24/16 257/712 |
| 2015/0206822 A1* | 7/2015 | Oda | H01L 23/433 428/192 |
| 2015/0279761 A1* | 10/2015 | Bet-Shliemoun | H01L 23/04 257/714 |
| 2017/0236804 A1* | 8/2017 | Hembree | H01L 23/3675 257/712 |
| 2018/0012820 A1* | 1/2018 | Antoniswamy | H01L 23/3675 |
| 2018/0082936 A1* | 3/2018 | Syu | H01L 23/4334 |
| 2019/0385929 A1* | 12/2019 | Ku | H01L 25/0655 |
| 2020/0168523 A1* | 5/2020 | Huang | H01L 21/4882 |
| 2021/0111093 A1* | 4/2021 | Sinha | H01L 23/10 |
| 2021/0118767 A1* | 4/2021 | Chi | H01L 23/3737 |

* cited by examiner

SEMICONDUCTOR DEVICE HAVING FIRST HEAT SPREADER AND SECOND HEAT SPREADER AND MANUFACTURING METHOD THEREOF

CROSS-REFERENCE TO RELATED APPLICATION

This application claims the priority benefit of U.S. provisional application Ser. No. 63/166,251, filed on Mar. 26, 2021. The entirety of the above-mentioned patent application is hereby incorporated by reference herein and made a part of this specification.

BACKGROUND

The semiconductor integrated circuit (IC) industry has experienced rapid growth. Over the course of this growth, functional density of the devices has generally increased by the device feature size. This scaling down process generally provides benefits by increasing production efficiency, lower costs, and/or improving performance. Such scaling down has also increased the complexities of processing and manufacturing IC. For these advances to be realized, developments in IC fabrication are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
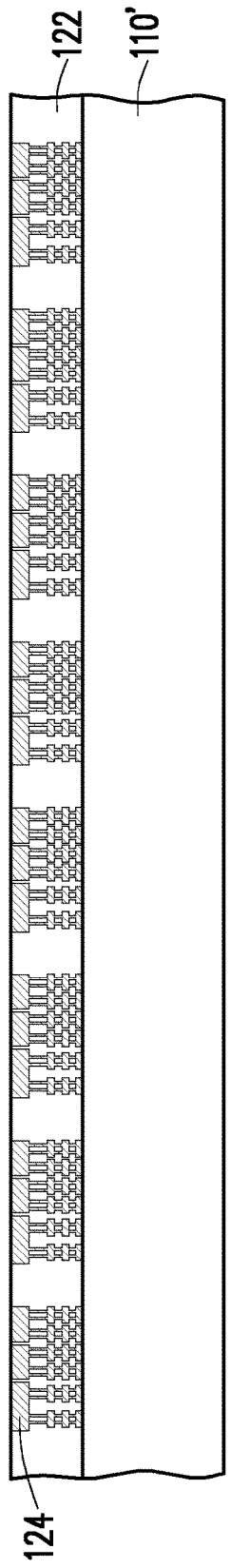
FIG. 1A to FIG. 1H are schematic cross-sectional views illustrating a manufacturing process of a semiconductor die in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1H are schematic cross-sectional views illustrating a manufacturing process of a semiconductor die 100 in accordance with some embodiments of the disclosure. Referring to FIG. 1A, a semiconductor wafer 110' is provided. In some embodiments, the semiconductor wafer 110' is made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor wafer 110' has active components (e.g., transistors or the like) and passive components (e.g., resistors, capacitors, inductors, or the like) formed therein.

In some embodiments, an interconnection structure 120 is formed on the semiconductor wafer 110'. In some embodiments, the interconnection structure 120 includes an inter-dielectric layer 122 and a plurality of patterned conductive layers 124. For simplicity, the inter-dielectric layer 122 is illustrated as a bulky layer in FIG. 1A, but it should be understood that the inter-dielectric layer 122 may be constituted by multiple dielectric layers. The patterned conductive layers 124 and the dielectric layers of the inter-dielectric layer 122 are stacked alternately. In some embodiments, two vertically adjacent patterned conductive layers 124 are electrically connected to each other through conductive vias sandwiched therebetween.

In some embodiments, a material of the inter-dielectric layer 122 includes polyimide, epoxy resin, acrylic resin, phenol resin, benzocyclobutene (BCB), polybenzoxazole (PBO), or other suitable polymer-based dielectric materials. The inter-dielectric layer 122 may be formed by suitable fabrication techniques, such as spin-on coating, chemical vapor deposition (CVD), plasma-enhanced chemical vapor deposition (PECVD), or the like. In some embodiments, a material of the patterned conductive layers 124 includes aluminum, titanium, copper, nickel, tungsten, and/or alloys thereof. The patterned conductive layers 124 may be formed by electroplating, deposition, and/or photolithography and etching. It should be noted that the number of the patterned conductive layers 124 and the dielectric layers in the inter-dielectric layer 122 shown in FIG. 1A is merely an exemplary illustration, and the disclosure is not limited. In some alternative embodiments, the number of the patterned conductive layers 124 and the dielectric layers in the inter-dielectric layer 122 may be adjusted depending on the routing requirements.

Figure 1B:
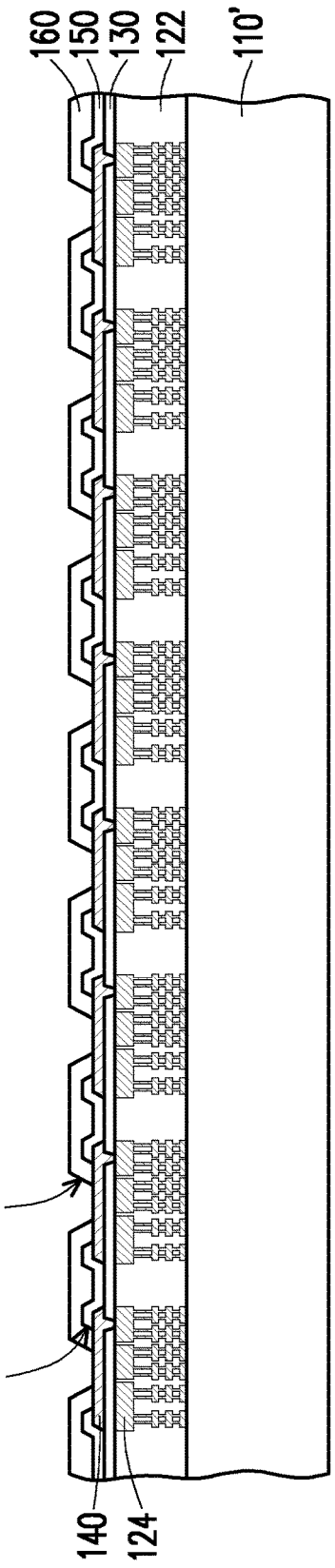

Referring to FIG. 1B, a dielectric layer 130 is formed over the interconnection structure 120. In some embodiments, a material of the dielectric layer 130 includes polyimide, epoxy resin, acrylic resin, phenol resin, BCB, PBO, or any other suitable polymer-based dielectric material. The dielectric layer 130 may be formed by suitable fabrication techniques, such as spin-on coating, CVD, PECVD, or the like. In some embodiments, a plurality of openings is formed in the dielectric layer 130 to expose portions of the topmost patterned conductive layer 124. After the openings are formed, a plurality of conductive pads 140 is formed over the dielectric layer 130. For example, the conductive pads 140 are formed over the semiconductor wafer 110' and the interconnection structure 120 such that the interconnection structure 120 is located between the semiconductor wafer 110' and the conductive pads 140. In some embodiments, the locations of the conductive pads 140 correspond to the locations of the openings of the dielectric layer 130. For example, the conductive pads 140 extend into the openings of the dielectric layer 130 to render electrical connection between the conductive pads 140 and portions of the interconnection structure 120 (i.e. the patterned conductive layer 124). In some embodiments, the conductive pads 140 are aluminum pads, copper pads, or other suitable metal pads. The number and the shape of the conductive pads 140 may be selected based on demand.

After the conductive pads 140 are distributed over the dielectric layer 130, a passivation layer 150 and a post-passivation layer 160 are sequentially formed over the dielectric layer 130 and the conductive pads 140. In some embodiments, the passivation layer 150 has a plurality of contact openings OP1 which partially exposes the conductive pads 140. In some embodiments, the passivation layer 150 is a silicon oxide layer, a silicon nitride layer, a silicon oxy-nitride layer, or a dielectric layer formed by other suitable dielectric materials. As illustrated in FIG. 1B, the post-passivation layer 160 covers the passivation layer 150 and has a plurality of contact openings OP2. The conductive pads 140 are partially exposed by the contact openings OP2 of the post-passivation layer 160. In some embodiments, the post-passivation layer 160 is a polyimide layer, a PBO layer, or a dielectric layer formed by other suitable polymers. It should be noted that the post-passivation layer 160 may be optional in some embodiments.

Figure 1C:
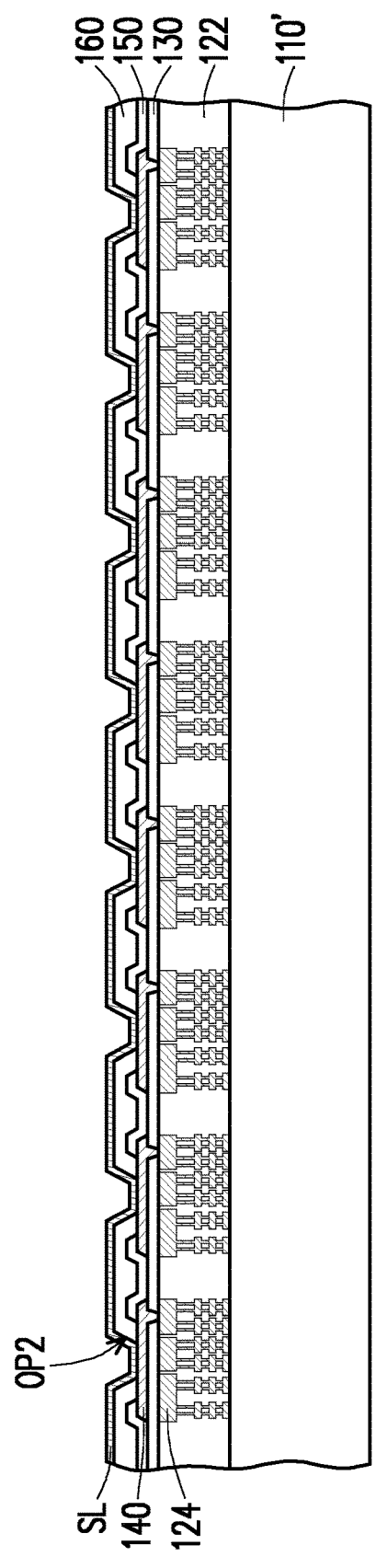

Referring to FIG. 1C, after forming the post-passivation layer 160, a seed layer SL is conformally formed on the post-passivation layer 160. For example, at least a portion of the seed layer SL extends into the contact openings OP2 of the passivation layer 160 to be in physical with the conductive pads 140. The seed layer SL may be formed through a sputtering process, a physical vapor deposition (PVD) process, or the like. In some embodiments, the seed layer SL is constituted by two sub-layers (not shown). The first sub-layer may include titanium, titanium nitride, tantalum, tantalum nitride, other suitable materials, or a combination thereof. On the other hand, the second sub-layer may include copper, copper alloys, or other suitable choice of materials.

Figure 1D:
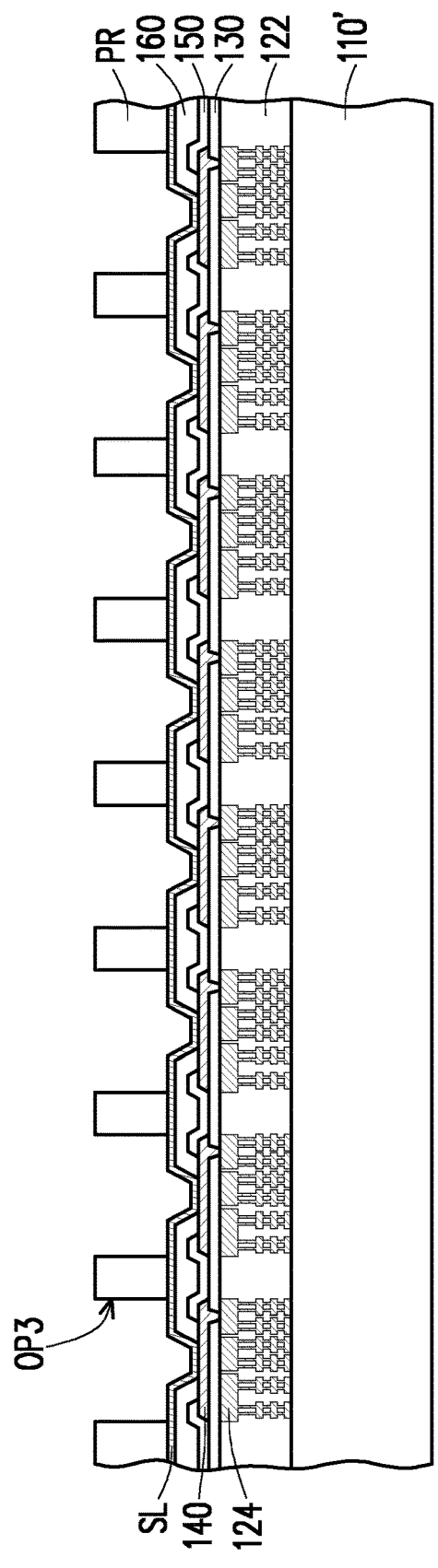

Referring to FIG. 1D, a patterned photoresist layer PR is formed over the seed layer SL. In some embodiments, the patterned photoresist layer PR is made of a photosensitive material. In some embodiments, the patterned photoresist layer PR has a plurality of openings OP3 partially exposing the seed layer SL above the contact pads 140. For example, the openings OP3 expose the seed layer SL located directly above the contact pads 140.

Figure 1E:
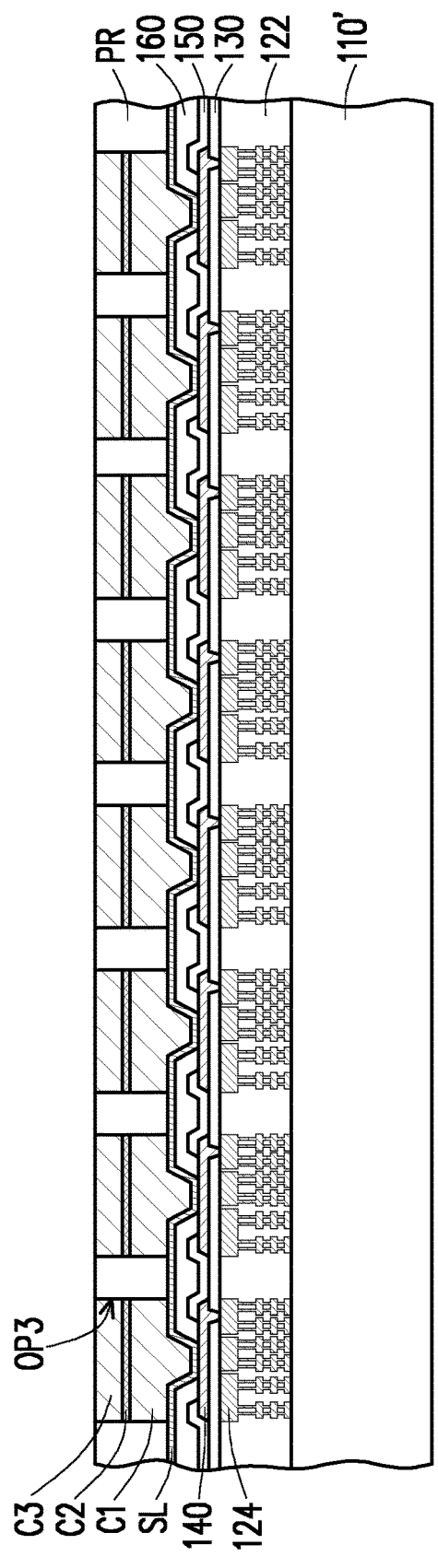

Referring to FIG. 1E, a first conductive layer C1, a second conductive layer C2, and a third conductive layer C3 are sequentially deposited onto the exposed seed layer SL. For example, the first conductive layer C1, the second conductive layer C2, and the third conductive layer C3 are filled into the openings OP3 of the patterned photoresist layer PR. In some embodiments, the first conductive layer C1, the second conductive layer C2, and the third conductive layer C3 are formed through the same technique. However, the disclosure is not limited thereto. In some alternative embodiments, the first conductive layer C1, the second conductive layer C2, and the third conductive layer C3 may be formed by different techniques. In some embodiments, the first conductive layer C1, the second conductive layer C2, and the third conductive layer C3 are formed through a plating process. The plating process is, for example, an electroplating process, an electroless-plating process, an immersion plating process, or the like. In some embodiments, materials of the first conductive layer C1, the second conductive layer C2, and the third conductive layer C3 are different. For example, the first conductive layer C1 is made of aluminum, titanium, copper, tungsten, and/or alloys thereof. On the other hand, the second conductive layer C2 is made of nickel. Moreover, the third conductive layer C3 is made of solder. In some embodiments, a thickness of the first conductive layer C1 is greater than a thickness of the second conductive layer C2 and a thickness of the third conductive layer C3. On the other hand, the thickness of third conductive layer C3 is greater than the thickness of the second conductive layer C2.

Figure 1F:
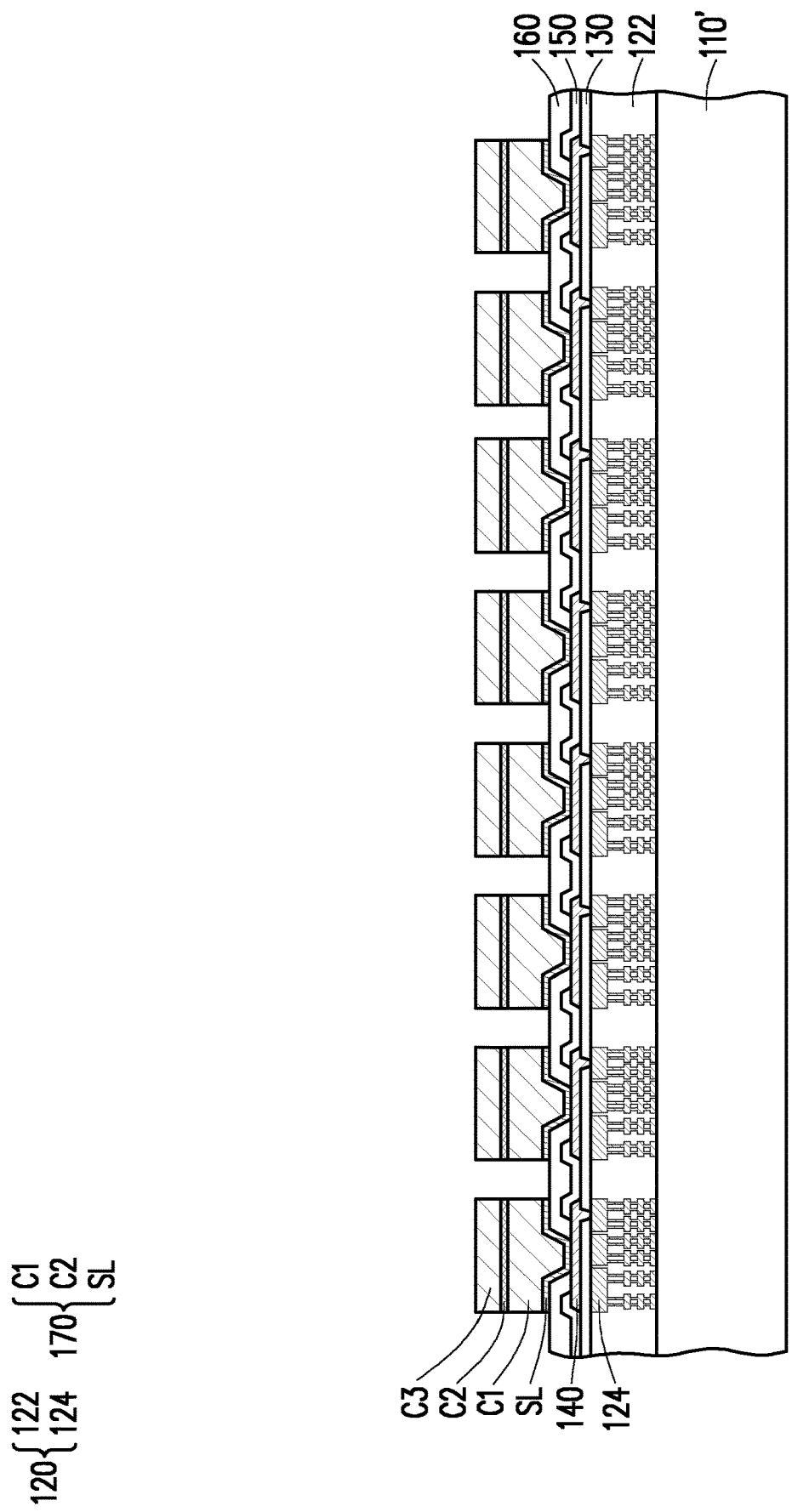

Referring to FIG. 1E and FIG. 1F, the patterned photoresist layer PR is removed. The patterned photoresist layer PR may be removed through an etching process, a stripping process, an ashing process, a combination thereof, or the like. Thereafter, by using the first conductive layer C1, the second conductive layer C2, and the third conductive layer C3 as hard masks, the seed layer SL that is uncovered by the first conductive layer C1, the second conductive layer C2, and the third conductive layer C3 is removed. In some embodiments, portions of the seed layer SL are removed through an etching process. After removal of portions of the seed layer SL, the remaining seed layer SL is located directly underneath the first conductive layer C1. That is, the seed layer SL is sandwiched between the contact pads 140 and the first conductive layer C1. In some embodiments, the remaining seed layer SL, the first conductive layer C1, and the second conductive layer C2 are collectively referred to as conductive posts 170.

Figure 1G:
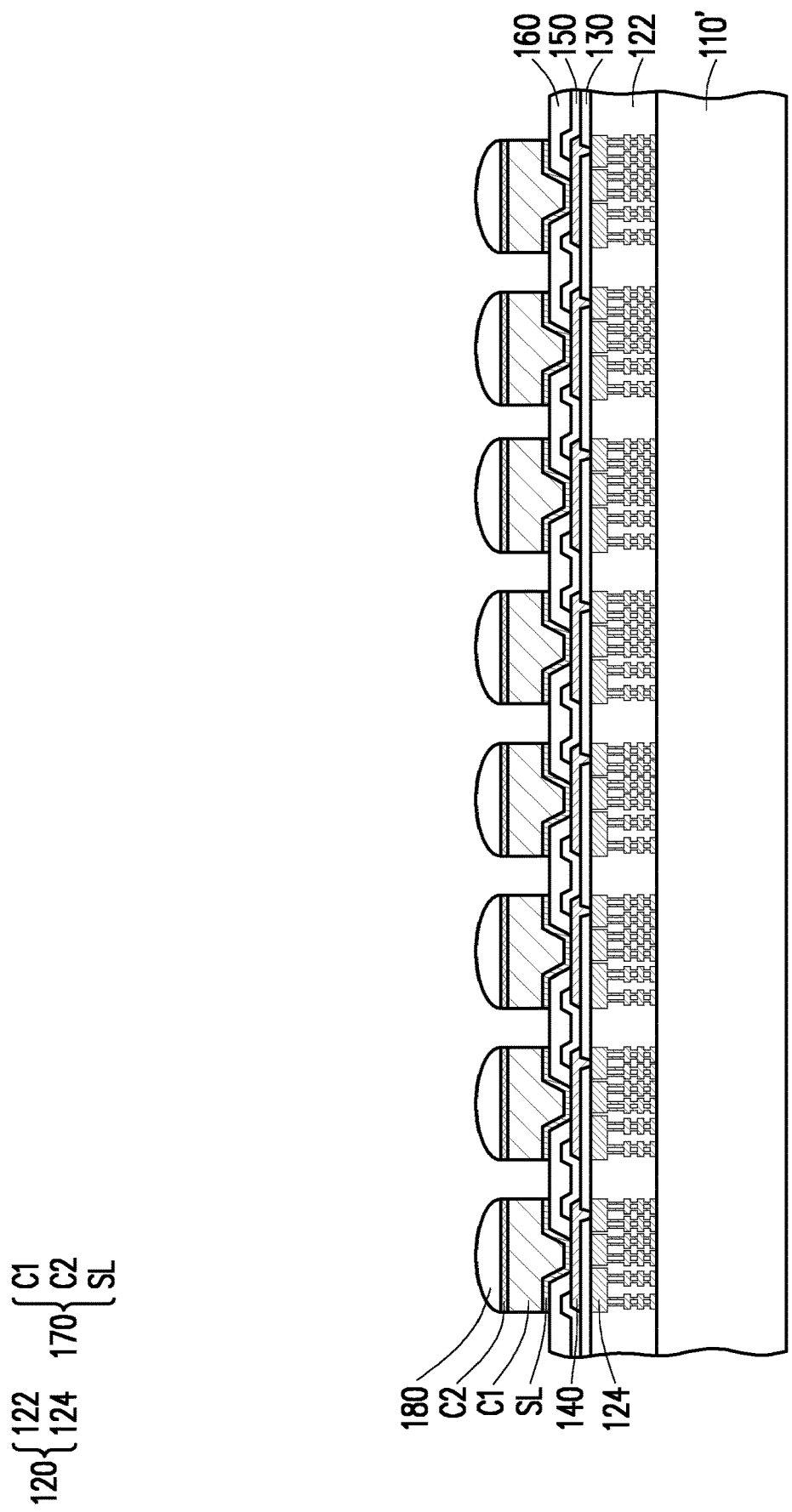

Referring to FIG. 1F and FIG. 1G, a reflow process is performed on the third conductive layer C3 to transform the third conductive layer C3 into conductive terminals 180. That is, the conductive terminals 180 are formed on the conductive posts 170. In some embodiments, the third conductive layer C3 is reshaped during the reflow process to form hemispherical conductive terminals 180.

Figure 1H:
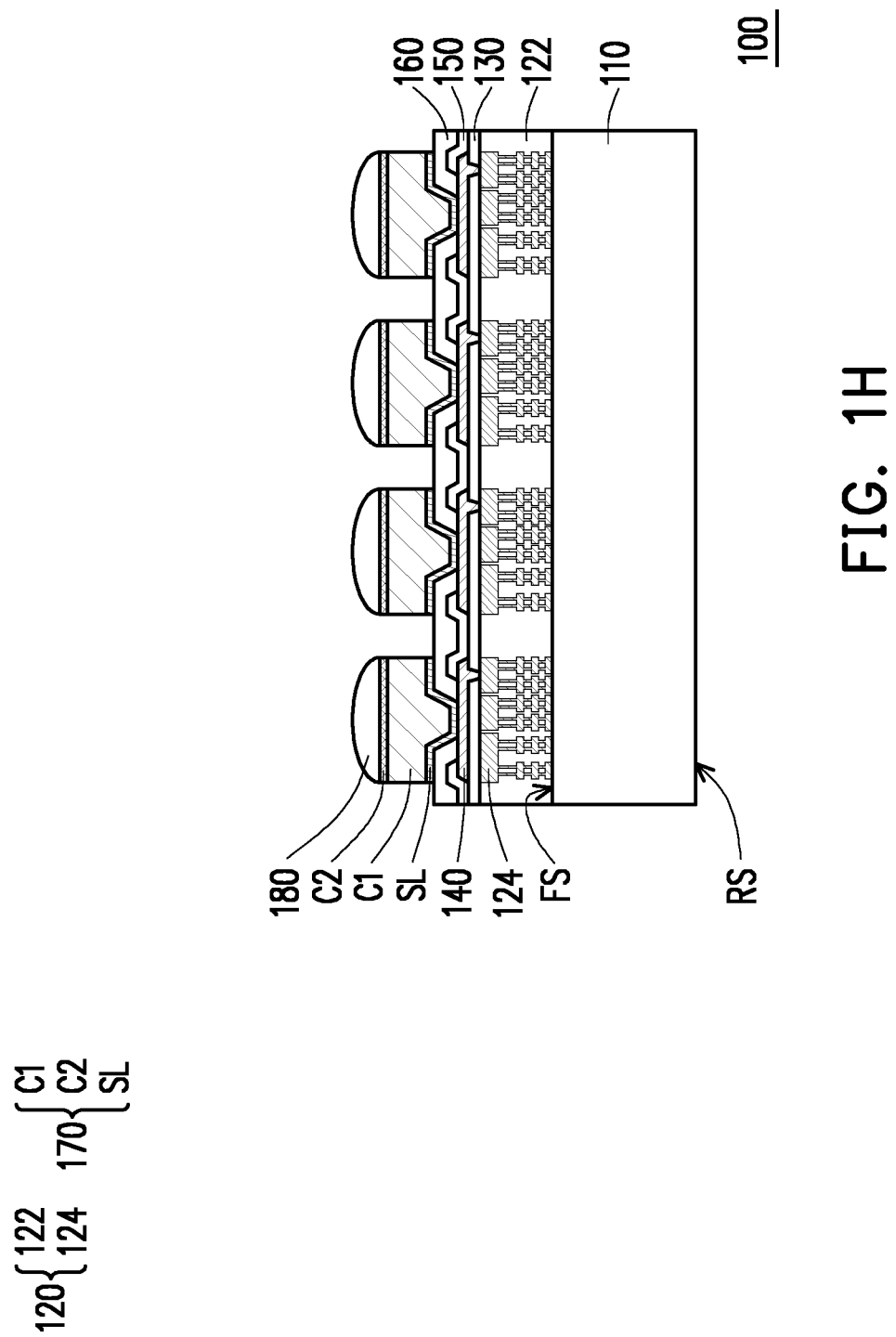

Referring to FIG. 1G and FIG. 1H, the structure illustrated in FIG. 1G is singulated to render a plurality of semiconductor dies 100 shown in FIG. 1H. In some embodiments, the singulation process typically involves dicing with a rotation blade and/or a laser beam. In other words, the singulation process includes a laser cutting process, a mechanical cutting process, a laser grooving process, other suitable processes, or a combination thereof. For example, a laser grooving process may be performed on the structure illustrated in FIG. 1G to form trenches (not shown) in the said structure. Thereafter, a mechanical cutting process may be performed on the locations of the trenches to cut through the said structure, so as to divide the semiconductor wafer 110' into semiconductor substrates 110 and to obtain the semiconductor die 100.

As illustrated in FIG. 1H, the semiconductor die 100 includes the semiconductor substrate 110, the interconnection structure 120, the dielectric layer 130, the conductive pads 140, the passivation layer 150, the post-passivation layer 160, the conductive posts 170, and the conductive terminals 180. In some embodiments, the semiconductor substrate 110 has a front surface FS and a rear surface RS opposite to the front surface FS. The interconnection structure 120 is disposed on the front surface FS of the semiconductor substrate 110. The dielectric layer 130, the conductive pads 140, the passivation layer 150, and the post-passivation layer 160 are sequentially disposed over the interconnection structure 120. The conductive posts 170 are disposed over the post-passivation layer 160 and are electrically connected to the conductive pads 140. The conductive terminals 180 are disposed on the conductive posts 170.

In some embodiments, the semiconductor die 100 is capable of performing logic functions. For example, the semiconductor die 100 may be a Central Process Unit (CPU) die, a Graphic Process Unit (GPU) die, a Field-Programmable Gate Array (FPGA), or the like. In some embodiments, the semiconductor die 100 may be utilized in a package structure. For example, the semiconductor die 100 may be assembled with other components to form a package structure. The manufacturing process of the package structure utilizing the semiconductor die 100 will be described below.

Figure 2A:
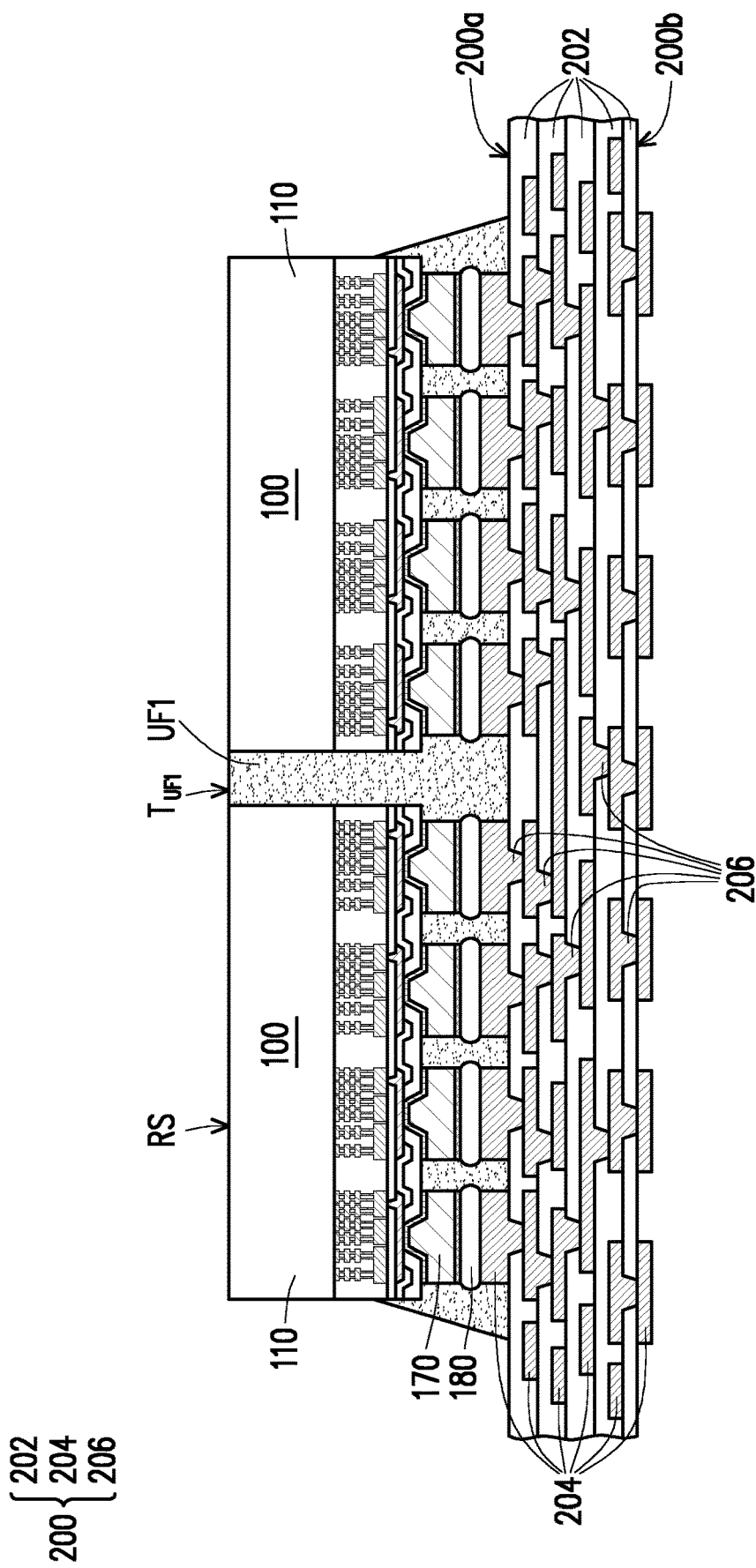
FIG. 2A to FIG. 2C are schematic cross-sectional views illustrating a manufacturing process of a package structure in accordance with some embodiments of the disclosure.
Figure 2B:
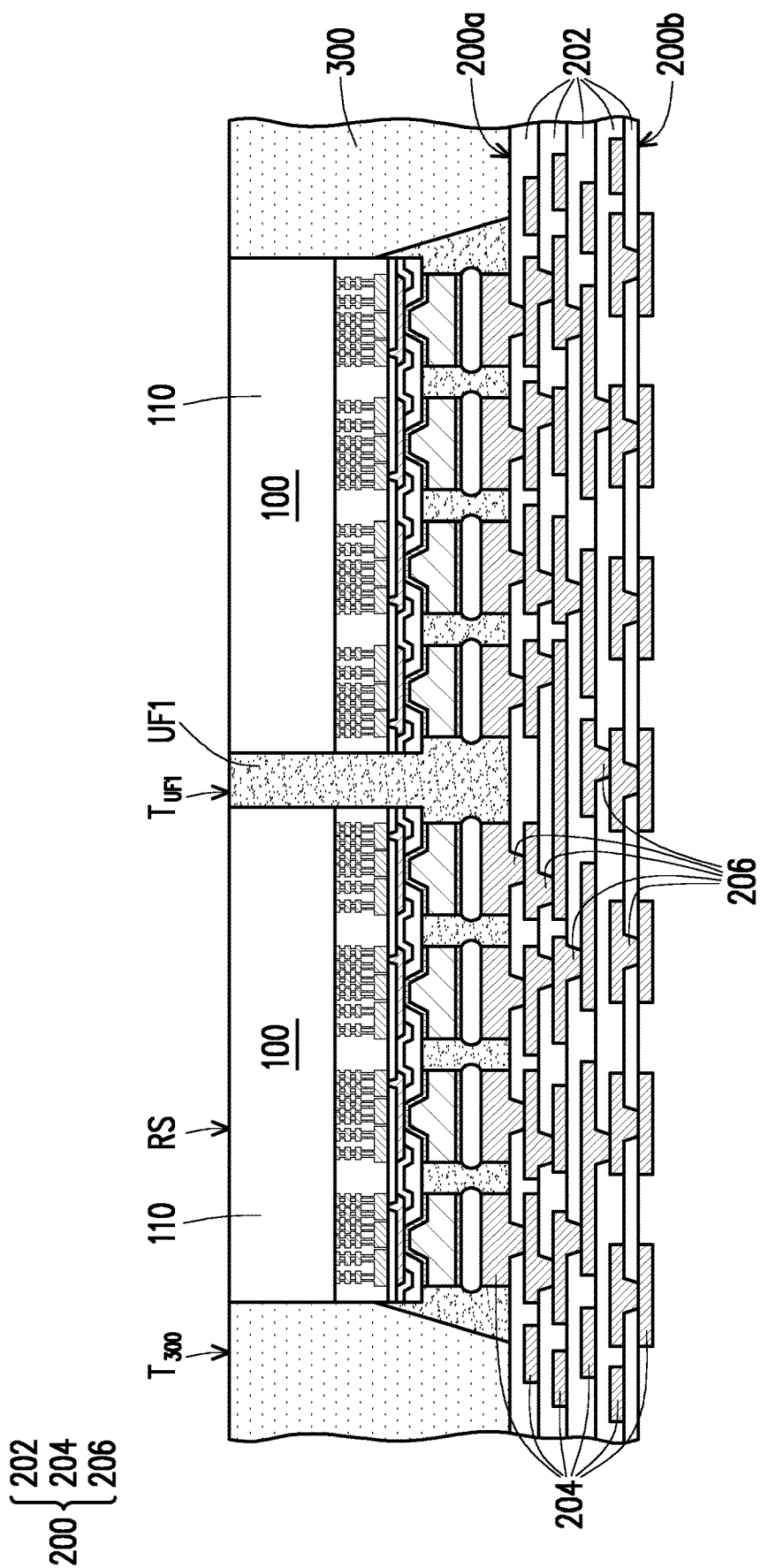
Figure 2C:
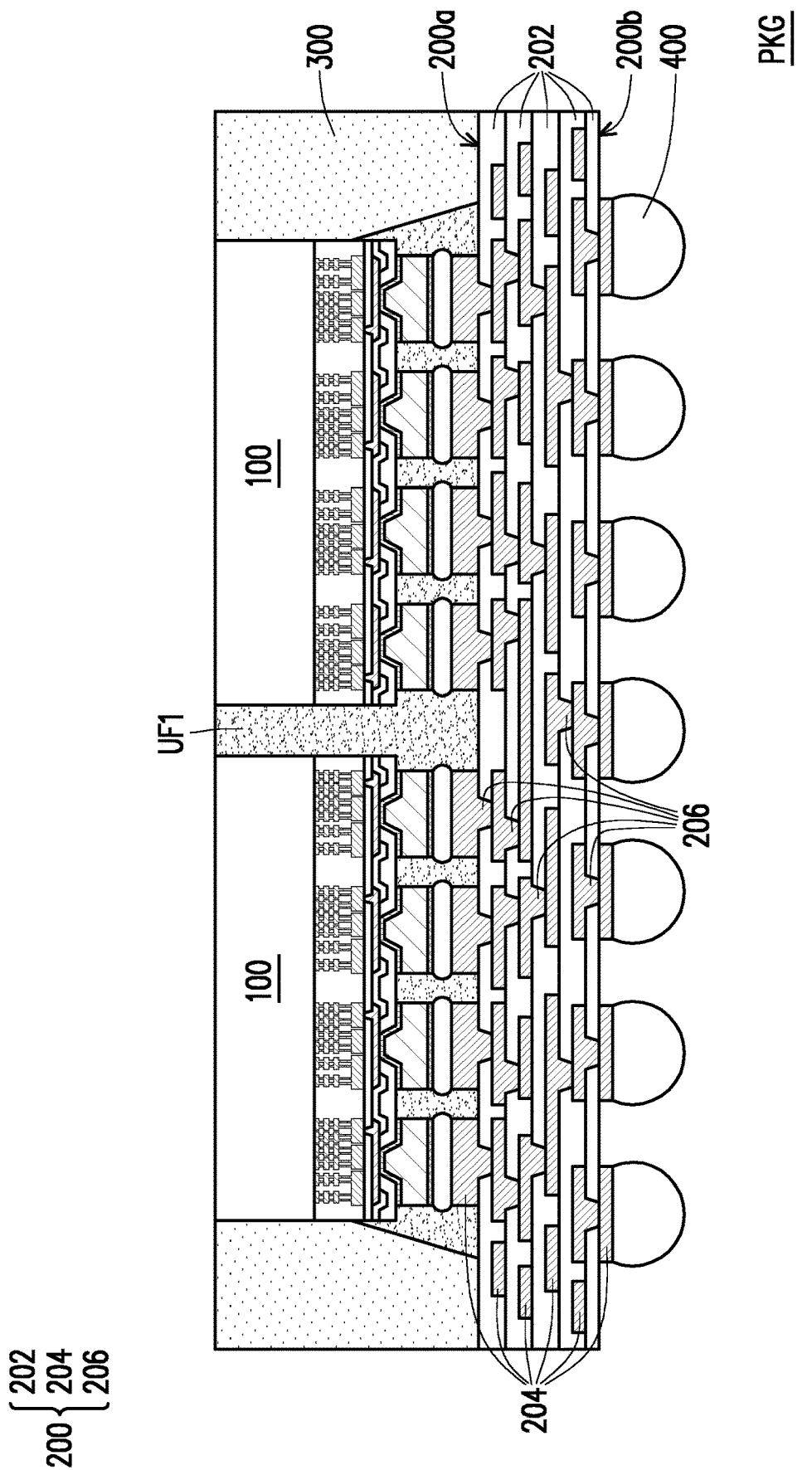

FIG. 2A to FIG. 2C are schematic cross-sectional views illustrating a manufacturing process of a package structure PKG in accordance with some embodiments of the disclosure. Referring to FIG. 2A, an interposer 200 is provided. In some embodiments, the interposer 200 includes a plurality of dielectric layers 202, a plurality of conductive pattern layers 204, and a plurality of conductive vias 206. In some embodiments, the dielectric layers 202 and the conductive pattern layers 204 are stacked alternately. On the other hand, the conductive vias 206 are embedded in the dielectric layers 202. In some embodiments, the conductive pattern layers 204 are interconnected with one another through the conductive vias 206. For example, the conductive vias 206 penetrate through the dielectric layers 202 to connect the conductive pattern layers 204. In some embodiments, each conductive pattern layer 204 includes a plurality of conductive patterns serving as redistribution wirings. In some embodiments, the conductive patterns of the outermost conductive pattern layers 204 (i.e. the topmost conductive pattern layer 204 and the bottommost conductive pattern layer 204) shown in FIG. 2A may be referred to as under-ball metallurgy (UBM) patterns for ball mount. In some embodiments, the conductive pattern layers 204 transmit signals horizontally and the conductive vias 206 transmit signals vertically.

In some embodiments, a material of the dielectric layers 202 includes polyimide, epoxy resin, acrylic resin, phenolic resin, benzocyclobutene (BCB), polybenzooxazole (PBO), or any other suitable polymer-based dielectric material. In some embodiments, the dielectric layers 202 include resin mixed with filler. The dielectric layers 202 may be formed by suitable fabrication techniques, such as film lamination, spin-on coating, chemical vapor deposition (CVD), plasma enhanced chemical vapor deposition (PECVD), or the like. In some embodiments, a material of the conductive pattern layers 204 and the conductive vias 206 includes aluminum, titanium, copper, nickel, tungsten, or alloys thereof. The conductive pattern layers 204 and the conductive vias 206 may be formed by electroplating, deposition, and/or photolithography and etching. In some embodiments, the conductive pattern layers 204 and the underlying conductive vias 206 are formed simultaneously. It should be noted that the number of the dielectric layers 202, the number of the conductive pattern layers 204, and the number of the conductive vias 206 illustrated in FIG. 2A are merely for illustrative purposes, and the disclosure is not limited thereto. In some alternative embodiments, fewer or more layers of the dielectric layers 202, the conductive pattern layers 204, and the conductive vias 206 may be formed depending on the circuit design.

In some embodiments, the interposer 200 has a first surface 200a and a second surface 200b opposite to the first surface 200a. The topmost conductive pattern layer 204 is exposed at the first surface 200a and the bottommost conductive pattern layer 204 is exposed at the second surface 200b. As illustrated in FIG. 2A, the interposer 200 is a redistribution layer (RDL) interposer. However, the disclosure is not limited thereto. In some alternative embodiments, other types of interposer, such as silicon interpose, organic interposer, or the like, may be utilized as the interposer 200.

As illustrated in FIG. 2A, a plurality of semiconductor dies 100 in FIG. 1H is bonded to the first surface 200a of the interposer 200. In some embodiments, the semiconductor dies 100 are attached to the interposer 200 through the conductive terminals 180. For example, the conductive terminals 180 of the semiconductor dies 100 are in physical contact with the topmost conductive pattern layer 204 exposed at the first surface 200a of the interposer 200 to render electrical connection between the semiconductor dies 100 and the interposer 200. In some embodiments, after the conductive terminals 180 are attached to the topmost conductive pattern layer 204 of the interposer 200, a reflow process is performed to reshape the conductive terminals 180.

In some embodiments, the semiconductor dies 100 are attached to the interposer 200 through flip-chip bonding. In other words, the semiconductor dies 100 are placed such that the rear surfaces RS of the semiconductor substrates 110 face upward. As show in FIG. 2A, two semiconductor dies 100 are bonded to the interposer 200. However, it should be noted that the number of the semiconductor dies 100 shown in FIG. 2A is merely an exemplary illustration, and the disclosure is not limited. In some alternative embodiments, the number of the semiconductor dies 100 may be adjusted depending on the design. For example, one single semiconductor die 100 may be bonded to the interposer 200 or more than two semiconductor dies 100 may be bonded to the interposer 200. Furthermore, as shown in FIG. 2A, two identical semiconductor dies 100 are bonded to the interposer 200. However, the disclosure is not limited thereto. In some alternative embodiments, semiconductor dies with different functions may be bonded to the interposer 200. For example, as mentioned above, the semiconductor die 100 is capable of performing logic functions. Therefore, in some alternative embodiments, one of the semiconductor dies 100 may be replaced by another die that is capable of performing storage function. For example, one of the semiconductor dies 100 may be replaced by a Dynamic Random Access Memory (DRAM), a Resistive Random Access Memory (RRAM), a Static Random Access Memory (SRAM), or the like.

In some embodiments, an underfill layer UF1 is formed over the interposer 200 to partially encapsulate the semiconductor dies 100. For example, the underfill layer UF1 wraps around the conductive posts 170 and the conductive terminals 180 of the semiconductor dies 100. The underfill layer UF1 also completely covers an inner sidewall of each semiconductor die 100 and partially covers outer sidewalls of each semiconductor die 100. For example, the portion of the underfill layer UF1 located between two adjacent semiconductor dies 100 has a top surface $T_{UF1}$ that is substantially coplanar with the rear surfaces RS of the semiconductor substrates 110 of the semiconductor dies 100. However, the disclosure is not limited thereto. In some alternative embodiments, the top surface $T_{UF1}$ of the underfill layer UF1 may be located below or above the rear surfaces RS of the semiconductor substrates 110. In some embodiments, a material of the underfill layer UF1 is an insulating material and includes a resin (e.g., epoxy resin), a filler material, a stress release agent (SRA), an adhesion promoter, other material, or a combination thereof. In some embodiments, the underfill layer UF1 is optional.

Referring to FIG. 2B, an encapsulant 300 is formed over the interposer 200 to encapsulate the semiconductor dies 100 and the underfill layer UF1. For example, the encapsulant 300 laterally encapsulates the semiconductor dies 100 and the underfill layer UF1. As illustrated in FIG. 2B, a top surface T300 of the encapsulant 300 is substantially coplanar with rear surfaces RS of the semiconductor substrates 110 of the semiconductor dies 100 and the top surface $T_{UF1}$ of the underfill layer UF1. That is, the encapsulant 300 exposes the semiconductor substrates 110 of the semiconductor dies 100. In some embodiments, the encapsulant 300 is a molding compound, a molding underfill, a resin (such as epoxy), or the like. In some embodiments, the encapsulant 300 includes fillers. The fillers may be particles made of silica, aluminum dioxide, or the like. In some embodiments, the encapsulant 300 is formed by a molding process, an injection process, a combination thereof, or the like. The molding process includes, for example, a transfer molding process, a compression molding process, or the like.

Referring to FIG. 2C, a plurality of conductive terminals 400 is formed on the second surface 200b of the interposer 200. In some embodiments, the conductive terminals 400 are solder balls, ball grid array (BGA) balls, or the like. In some embodiments, the conductive terminals 400 are made of a conductive material with low resistivity, such as Sn, Pb, Ag, Cu, Ni, Bi, or an alloy thereof. In some embodiments, the conductive terminals 400 are in physical contact with the bottommost conductive pattern layer 204 exposed at the second surface 200b of the interposer 200.

After the conductive terminals 400 are formed, a singulation process is performed on the encapsulant and the interposer 200 to obtain a plurality of package structures PKG. In some embodiments, the singulation process typically involves dicing with a rotation blade and/or a laser beam. In other words, the singulation process includes a laser cutting process, a mechanical cutting process, a laser grooving process, other suitable processes, or a combination thereof. In some embodiments, since the interposer 200 is in wafer form, the package structure PKG is considered to be formed by a chip-on-wafer process.

In some embodiments, the package structure PKG may be utilized in a semiconductor device. For example, the package structure PKG may be assembled with other components to form a semiconductor device. The manufacturing process of the semiconductor device utilizing the package structure PKG will be described below.

Figure 3A:
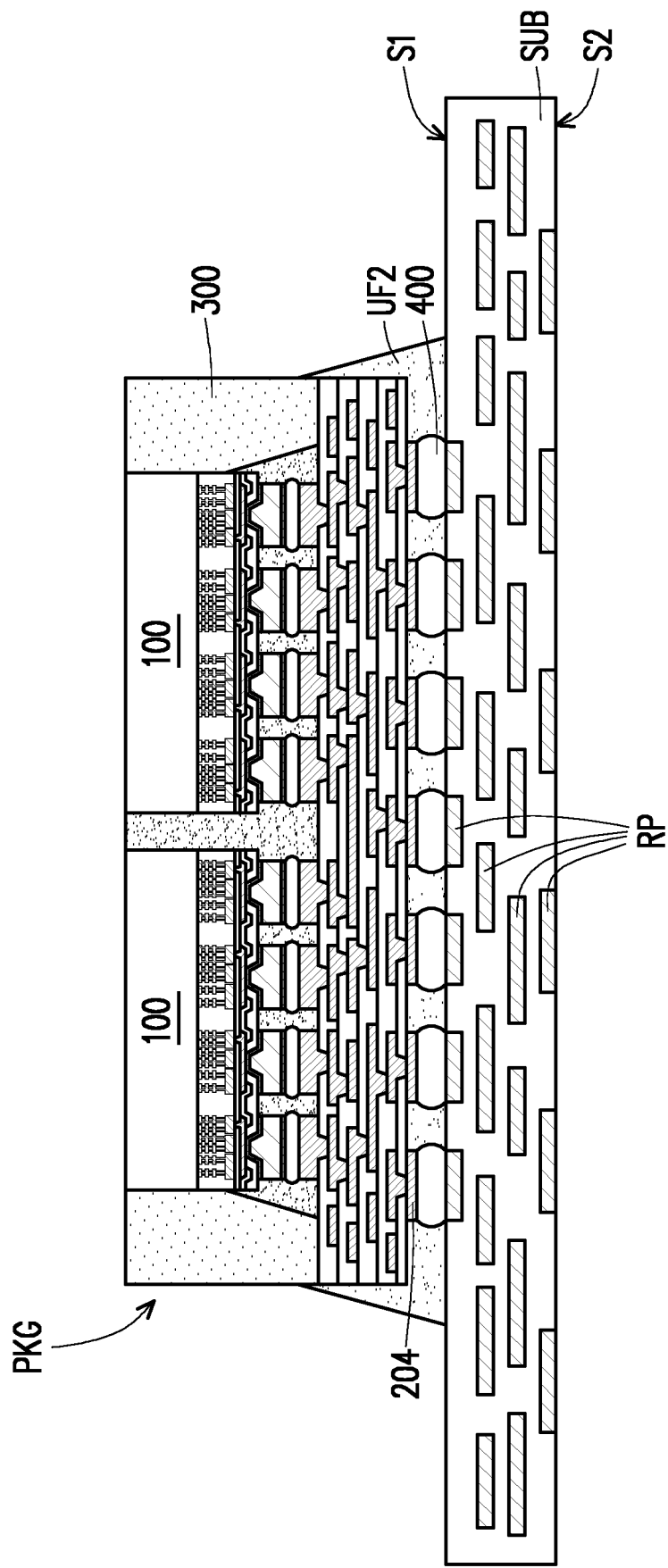
FIG. 3A to FIG. 3F are schematic cross-sectional views illustrating a manufacturing process of a semiconductor device in accordance with some embodiments of the disclosure.

FIG. 3A to FIG. 3F are schematic cross-sectional views illustrating a manufacturing process of a semiconductor device 10 in accordance with some embodiments of the disclosure. Referring to FIG. 3A, a substrate SUB is provided. In some embodiments, the substrate SUB is a printed circuit board (PCB) or the like. In some embodiments, the substrate SUB is referred to as a circuit substrate. In some embodiments, the substrate SUB includes a plurality of routing patterns RP embedded therein. In some embodiments, the routing patterns RP are interconnected with one another. That is, the routing patterns RP are electrically connected to one another. As illustrated in FIG. 3A, the substrate SUB has a first surface S1 and a second surface S2 opposite to the first surface S1. In some embodiments, some of the routing patterns RP are exposed at the first surface S1 and some of the routing patterns RP are exposed at the second surface S2.

As illustrated in FIG. 3A, the package structure PKG in FIG. 2C is bonded to the first surface S1 of the substrate SUB. In some embodiments, the package structure PKG is attached to the substrate SUB through the conductive terminals 400. For example, the conductive terminals 400 of the package structure PKG are in physical contact with the routing patterns RP exposed at the first surface S1 of the substrate SUB to render electrical connection between the package structure PKG and the substrate SUB. In some embodiments, after the conductive terminals 400 are attached to the routing patterns RP of the substrate SUB, a reflow process may be performed to reshape the conductive terminals 400.

In some embodiments, an underfill layer UF2 is formed between the package structure PKG and the first surface S1 of the substrate SUB. For example, the underfill layer UF2 wraps around the bottommost conductive pattern layer 204 and the conductive terminals 400 of the package structure PKG. In some embodiments, the underfill layer UF2 is utilized to protect these elements. In some embodiments, the underfill layer UF2 further covers portions of each sidewall of the package structure PKG. In some embodiments, a material of the underfill layer UF2 is an insulating material and includes a resin (e.g., epoxy resin), a filler material, a stress release agent (SRA), an adhesion promoter, other material, or a combination thereof. In some embodiments, the underfill layer UF2 is optional.

Figure 3B:
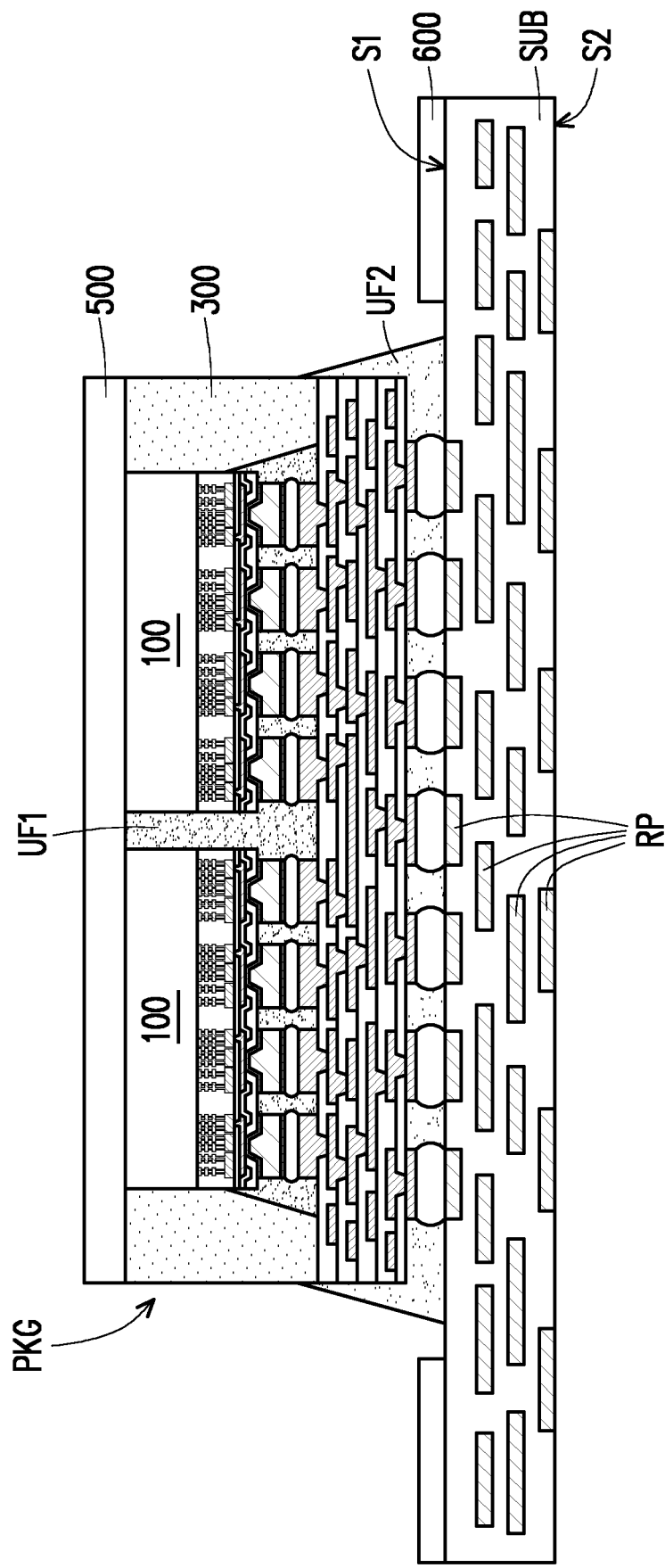

Referring to FIG. 3B, a thermal interface material (TIM) layer 500 is formed on the package structure PKG. The TIM layer 500 includes a polymer having a good thermal conductivity (Tk), which may be between about 3 Watts per Meter Kelvin (W/m·K) to about 5 W/m·K. In some embodiments, the TIM layer 500 further includes thermal conducive fillers dispersed in the polymer. The thermal conductive fillers may increase the effective Tk of the TIM layer 500 to be between about 10 W/m·K to about 50 W/m·K or more. Applicable materials for the thermal conductive filler include aluminum oxide, boron nitride, aluminum nitride, aluminum, copper, silver, indium, a combination thereof, or the like. In some alternative embodiments, the TIM layer 500 includes other materials such as a metallic-based or solder-based material comprising silver, indium paste, or the like. The TIM layer 500 may be in liquid form or may be a dry film. When the TIM layer 500 is in liquid form, the TIM layer 500 is dispensed/applied onto the package structure PKG. When the TIM layer 500 is a dry film, the TIM layer 500 is pasted onto the package structure PKG.

As illustrated in FIG. 3B, the TIM layer 500 is in physical contact with the semiconductor die 100, the underfill layer UF1, and the encapsulant 300. It should be noted that although the TIM layer 500 is illustrated as a continuous layer extending over the underfill layer UF1 and both of the semiconductor dies 100, the disclosure is not limited thereto. In some alternative embodiments, the TIM layer 500 may be a discontinuous layer. For example, the discontinuous patterns of the TIM layer 500 may respectively cover the semiconductor dies 100, and air gaps exist directly over the underfill layer UF1 that is located between the semiconductor dies 100. In some embodiments, the air gaps is able to further reduce lateral thermal interaction between the semiconductor dies 100.

As illustrated in FIG. 3B, an adhesive layer 600 is form on the first surface S1 of the substrate SUB. For example, the adhesive layer 600 is formed along edges of the first surface S1 of the substrate SUB to surround/encircle the package structure PKG and the underfill layer UF2. In some embodiments, the adhesive layer 600 partially covers the first surface S1 of the substrate SUB. For example, the package structure PKG and the underfill layer UF2 are physically isolated from the adhesive layer 600. As mentioned above, the adhesive layer 600 is formed along edges of the first substrate S1 of the substrate SUB, so the shape of the adhesive layer 600 depends on the shape of the substrate SUB. For example, when the substrate SUB is in wafer form (i.e. having a circular top view), the adhesive layer 600 exhibits a circular ring shape from the top view. When the substrate SUB is in panel form (i.e. having a rectangular or squared top view), the adhesive layer exhibits a rectangular ring shape or a squared ring shape from the top view. In some embodiments, the adhesive layer 600 is applied onto the substrate SUB through dispensing, spin-coating, or the like.

In some embodiments, a material of the adhesive layer 600 is different from the material of the TIM layer 500. For example, the adhesive layer 600 has a better adhering ability and a lower thermal conductivity than the TIM layer 500. In some embodiments, the adhesive layer 600 has a thermal conductivity lower than about 0.5 W/m·K. In some embodiments, the adhesive layer 600 includes an epoxy-based material. However, the disclosure is not limited to. In some alternative embodiments, other polymeric materials having adhering property may be utilized as the adhesive layer 600.

Figure 3C:
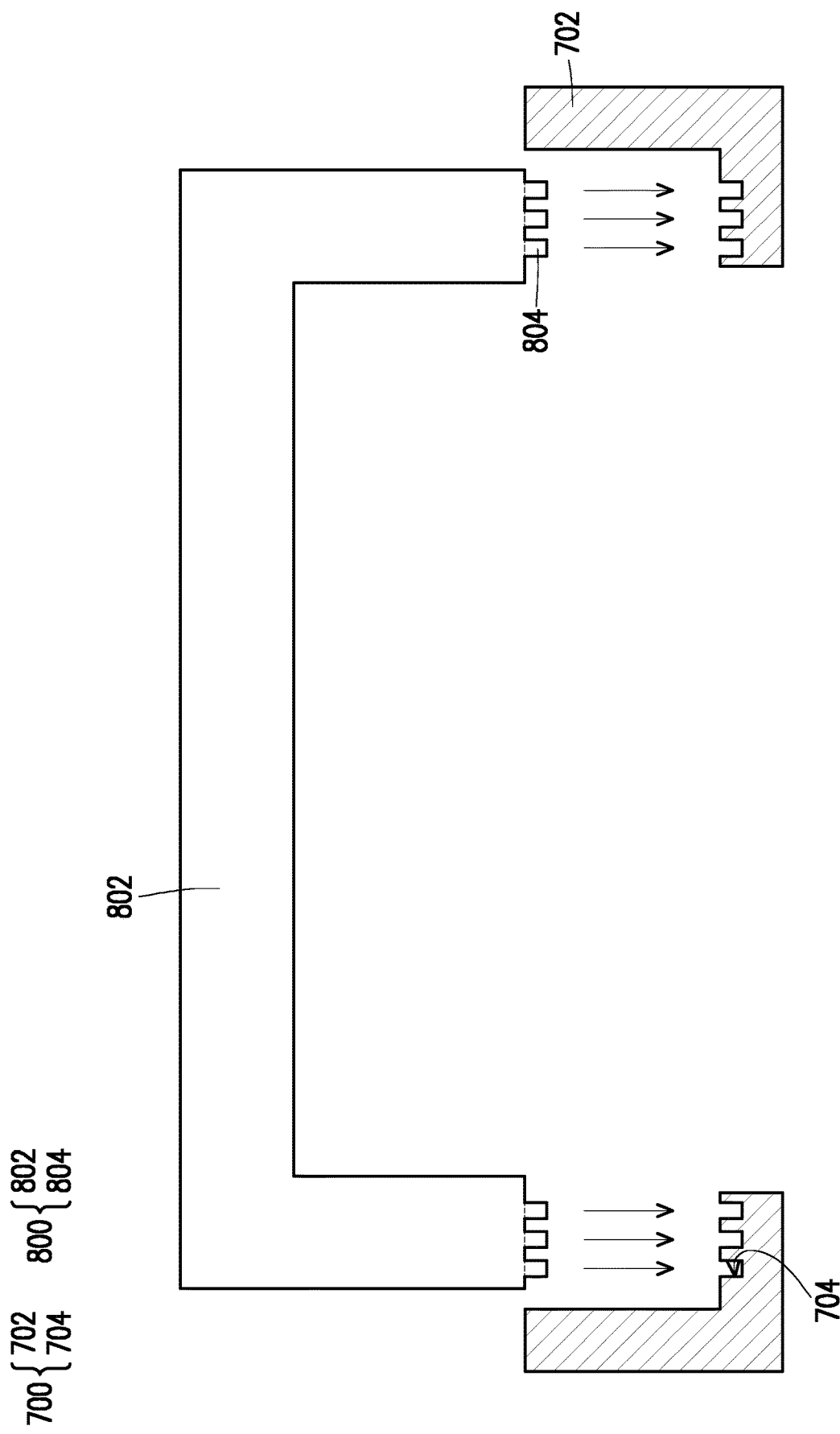
Figure 3D:
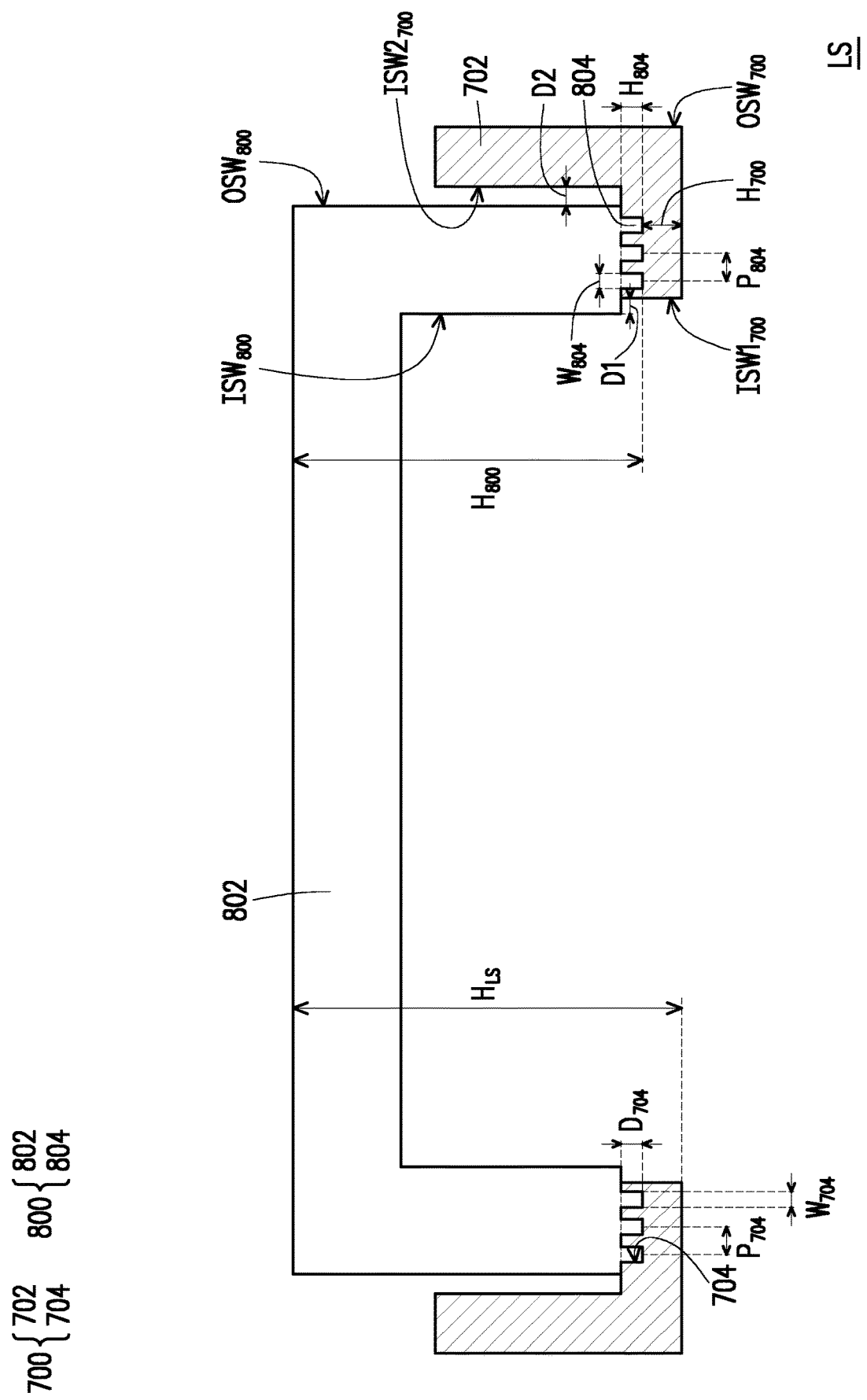

Referring to FIG. 3C and FIG. 3D, a lid structure LS is provided. In some embodiments, the lid structure LS includes a first heat spreader 700 and a second heat spreader 800, and the first heat spreader 700 is connected to the second heat spreader 800. For example, the lid structure LS is formed by assembling the first heat spreader 700 and the second heat spreader 800. In other words, the first heat spreader 700 is engaged to the second heat spreader 800 to form the lid structure LS. In some embodiments, the first heat spreader 700 is a rim structure (shown in FIG. 4) from a perspective view, and the second heat spreader 800 is a hat structure (shown in FIG. 4) from the perspective view.

In some embodiments, the material of the first heat spreader 700 is different from the material of the second heat spreader 800. For example, a material of the first heat spreader 700 includes copper-tungsten alloy, alloy 42 (nickel-iron alloy having 42% of nickel), or the like. On the other hand, a material of the second heat spreader 800 includes copper, silver diamond, copper-molybdenum alloy (50%:50% or 40%:60%), copper-tungsten alloy, or the like. It should be noted that although copper-tungsten alloy is an overlapping material for both of the first heat spreader 700 and the second heat spreader 800, the first heat spreader 700 and the second heat spreader 800 cannot use copper-tungsten alloy as materials thereof simultaneously. In some embodiments, when the material of the first heat spreader 700 is copper-tungsten alloy, the material of the second heat spreader 800 is copper. On the other hand, when the material of the first heat spreader 700 is alloy 42, the material of the second heat spreader 800 may be selected from silver diamond, copper-molybdenum alloy (50%:50% or 40%:60%), and copper-tungsten alloy.

In some embodiments, a coefficient of thermal expansion (CTE) and a Young's modulus of the first heat spreader 700 are respectively different form a CTE and a Young's modulus of the second heat spreader 800. In some embodiments, the CTE of the first heat spreader 700 ranges from about 4.35 ppm/° C. to about 10.5 ppm/° C. and the CTE of the second heat spreader 800 range from about 7.2 ppm/° C. to about 17 ppm/° C. On the other hand, the Young's modulus of the first heat spreader 700 ranges from about 145 GPa to about 330 GPa and the Young's modulus of the second heat spreader 800 ranges from about 110 GPa to about 330 GPa. In some embodiments, when the material of the first heat spreader 700 is copper-tungsten alloy or alloy 42, the CTE of the first heat spreader 700 is respectively 10.5 ppm/° C. or 4.35 ppm/° C., and the Young's modulus of the first heat spreader 700 is respectively 330 GPa or 145 GPa. In some embodiments, when the material of the second heat spreader 800 is copper, silver diamond, copper-molybdenum alloy (50%:50%), copper-molybdenum alloy (40%:60%), or copper-tungsten alloy, the CTE of second heat spreader 800 is respectively 17 ppm/° C., 7.2 ppm/° C., 12.1 ppm/° C., 10.5 ppm/° C., or 10.5 ppm/° C., and the Young's modulus of the second heat spreader 800 is respectively 110 GPa, 275 GPa, 120 GPa, 170 GPa, or 330 GPa. In some embodiments, a ratio of the CTE of the second heat spreader 800 to the CTE of the first heat spreader 700 ranges from about 1:0.36 to about 1:0.62. In some embodiments, a ratio of the Young's modulus of the second heat spreader 800 to the Young's modulus of the first heat spreader 700 ranges from about 1:0.44 to about 1:3.

In some embodiments, the first heat spreader 700 includes a body portion 702 and a plurality of recesses 704 recessing from a top surface of the body portion 702. As illustrated in the cross-sectional view of FIG. 3C, the body portion 702 exhibits an L shape, and the recesses 704 are formed on the L-shaped base. In some embodiments, each recess 704 exhibits a ring shape from a top view. In other words, the recesses 704 are concentric rings from the top view. In some embodiments, the recesses 704 are formed by removing a portion of the body portion 702 through etching, cutting, drilling, or the like. In some embodiments, the second heat spreader 800 includes a body portion 802 and a plurality of protrusions 804 protruding from a bottom surface of the body portion 802. As illustrated in FIG. 3C, the body portion 802 exhibit an upside down U shape, and the protrusions 804 are formed on the legs of the upside down U. In some embodiments, the protrusions 804 and the body portion 802 of the second heat spreader 800 are integrally formed. For example, the protrusions 804 may be formed by removing a portion of the body portion 802 through etching, cutting, drilling, or the like. In some embodiments, each protrusion 804 exhibits a ring shape from a bottom view. In other words, the protrusion 804 are concentric rings from the bottom view. In some embodiments, the first heat spreader 700 and the second heat spreader 800 are assembled by engaging the protrusions 804 of the second heat spreader 800 to the recesses 704 of the second heat spreader 700, as illustrated in FIG. 3C. The dimensions of the lid structure LS will be described below in conjunction with FIG. 3D.

Referring to FIG. 3D, the lid structure LS has a height $H_{LS}$ ranging from about 3.45 mm to about 4.0 mm. In some embodiments, the first heat spreader 700 has a minimum height $H_{700}$ ranging from about 0.75 mm to about 2.45 mm. Meanwhile, the second heat spreader 800 has a maximum height $H_{800}$ ranging from about 1 mm to about 2.7 mm. In some embodiments, a depth $D_{704}$ of each recess 704 is in a range of greater than 0 μm and less than 1500 μm. On the other hand, a width $W_{704}$ of each recess 704 is in a range of greater than 0 μm and less than 1000 μm. As illustrated in FIG. 3D, each recess 704 of the first heat spreader 700 has substantially the same depth $D_{704}$. Moreover, each recess 704 of the first heat spreader 700 may have substantially the same width $W_{704}$. In some embodiments, a pitch $P_{704}$ between two adjacent recesses 704 (i.e. a distance between centers of the two adjacent recesses 704) is in a range of greater than 0 μm and less than 2500 μm. In some embodiments, a height $H_{804}$ of each protrusion 804 is in a range of greater than 0 μm and less than 1500 μm. On the other hand, a width $W_{804}$ of each protrusion 804 is in a range of greater than 0 μm and less than 1000 μm. As illustrated in FIG. 3D, each protrusion 804 of the second heat spreader 800 has substantially the same height $H_{804}$. Moreover, each protrusion 804 of the second heat spreader 800 may have substantially the same width $W_{804}$. In some embodiments, a pitch $P_{804}$ between two adjacent protrusions 804 (i.e. a distance between centers of the two adjacent protrusions 804) is in a range of greater than 0 μm and less than 2500 μm.

In some embodiments, the recesses 704 of the first heat spreader 700 and the corresponding protrusions 804 of the second heat spreader 800 are perfect fit. In other words, the width $W_{804}$ of each protrusion 804 of the second heat spreader 800 is substantially the same as the width $W_{704}$ of the corresponding recess 704 of the first heat spreader 700, and the height $H_{804}$ of each protrusion 804 of the second heat spreader 800 is substantially the same as the depth $D_{704}$ of the corresponding recess 704 of the first heat spreader 700. That is, a shape of each protrusion 804 of the second heat spreader 800 is substantially identical to a shape of the corresponding recess 704 of the first heat spreader 700. As such, the protrusions 804 of the second heat spreader 800 are securely fitted into the recesses 704 of the first heat spreader 700 without the presence of any adhesive material. For example, the protrusions 804 of the second heat spreader 800 are being wrapped around and being securely fixed by the body portion 702 of the first heat spreader 700. In other words, the first heat spreader 700 is in physical contact with the second heat spreader 800. As such, the lid structure LS is considered to have a fool-proof design for assembly.

It should be noted that in some alternative embodiments, the protrusions 804 of the second heat spreader 800 and the recesses 704 of the first heat spreader 700 may not be in perfect fit. For example, in some alternative embodiments, the width $W_{804}$ of each protrusion 804 of the second heat spreader 800 is substantially the same as the width $W_{704}$ of the corresponding recess 704 of the first heat spreader 700, but the height $H_{804}$ of each protrusion 804 of the second heat spreader 800 is different from the depth $D_{704}$ of the corresponding recess 704 of the first heat spreader 700. Although the height $H_{804}$ of the protrusions 804 is different from the depth $D_{704}$ of the recesses 704, due to the same widths (i.e. the width $W_{804}$ of the protrusions 804 is substantially the same as the width $W_{704}$ of the recesses 704), the protrusions 804 can still be securely engaged to the recesses 704 without the presence of any adhesive material.

As mentioned above, the first heat spreader 700 exhibits an L shape from the cross-sectional view. As such, the first heat spreader 700 has a first inner sidewall $ISW1_{700}$ and a second inner sidewall $ISW2_{700}$, as illustrated in FIG. 3D. Meanwhile, the first heat spreader 700 has one outer sidewall $OSW_{700}$ opposite to the first inner sidewall $ISW1_{700}$ and the second inner sidewall $ISW2_{700}$. In some embodiments, the second heat spreader 800 has an inner sidewall $ISW_{800}$ and an outer sidewall $OSW_{800}$ opposite to the inner sidewall $ISW_{800}$. As illustrated in FIG. 3D, the first inner sidewall $ISW1_{700}$ of the first heat spreader 700 and the inner sidewall $ISW_{800}$ of the second heat spreader 800 has an offset. For example, a distance D1 of about 200 μm to about 500 μm is found between the first inner sidewall $ISW1_{700}$ of the first heat spreader 700 and the inner sidewall $ISW_{800}$ of the second heat spreader 800. As illustrated in FIG. 3D, the outer sidewalls $OSW_{800}$ of the second heat spreader 800 is spaced apart from the second inner sidewall $ISW2_{700}$ of the first heat spreader 700. For example, a distance D2 of about 200 μm to about 500 μm is found between the outer sidewalls $OSW_{800}$ of the second heat spreader 800 and the second inner sidewall $ISW2_{700}$ of the first heat spreader 700.

Figure 3E:
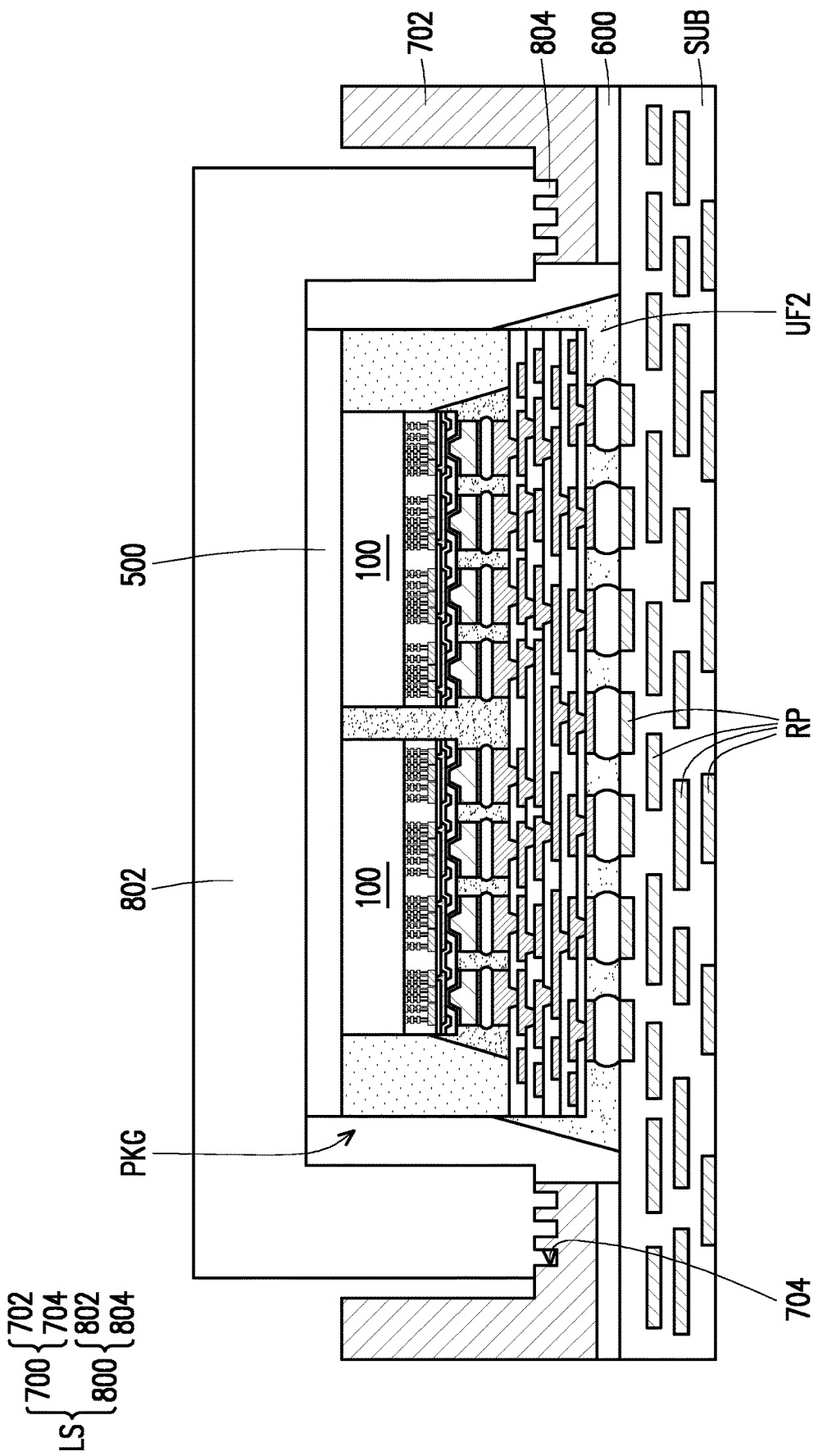

Referring to FIG. 3E, the lid structure LS illustrated in FIG. 3D is disposed on the substrate SUB and the package structure PKG such that the package structure PKG is located between the lid structure LS and the substrate SUB. In some embodiments, the lid structure LS is attached to the substrate SUB and the package structure PKG through the TIM layer 500 and the adhesive layer 600. For example, the lid structure LS is placed over the substrate SUB and the package structure PKG and is being pressed against the TIM layer 500 and the adhesive layer 600 such that the first heat spreader 700 is attached to the substrate SUB through the adhesive layer 600 and the second heat spreader 800 is attached to the package structure PKG through the TIM layer 500. As illustrated in FIG. 3E, the first heat spreader 700 surrounds the package structure PKG and the underfill layer UF2. In some embodiments, the first heat spreader 700 is spatially separated from the package structure PKG and the underfill layer UF2. In some embodiments, the second heat spreader 800 is disposed over the package structure PKG and is spatially separated from the substrate SUB.

As illustrated in FIG. 3E, sidewalls of the first heat spreader 700 are aligned with sidewalls of the adhesive layer 600. However, the disclosure is not limited thereto. In some alternative embodiments, depending on the amount of adhesive layer 600 applied in the step illustrated in FIG. 3B, the adhesive layer 600 may overflow over the sidewalls of the first heat spreader 700 or may be deficient to flow to the sidewalls of the first heat spreader 700 during the attaching process of the lid structure LS. That is, in some alternative embodiments, sidewalls of the first heat spreader 700 are not aligned with sidewalls of the adhesive layer 600. Similarly, as illustrated in FIG. 3E, sidewalls of the package structure PKG are aligned with sidewalls of the TIM layer 500. However, the disclosure is not limited thereto. In some alternative embodiments, depending on the amount of TIM layer 500 applied in the step illustrated in FIG. 3B, the TIM layer 500 may overflow over the sidewalls of the package structure PKG or may be deficient to flow to the sidewalls of the package structure PKG during the attaching process of the lid structure LS. That is, in some alternative embodiments, sidewalls of the package structure PKG are not aligned with sidewalls of the TIM layer 500.

Figure 3F:
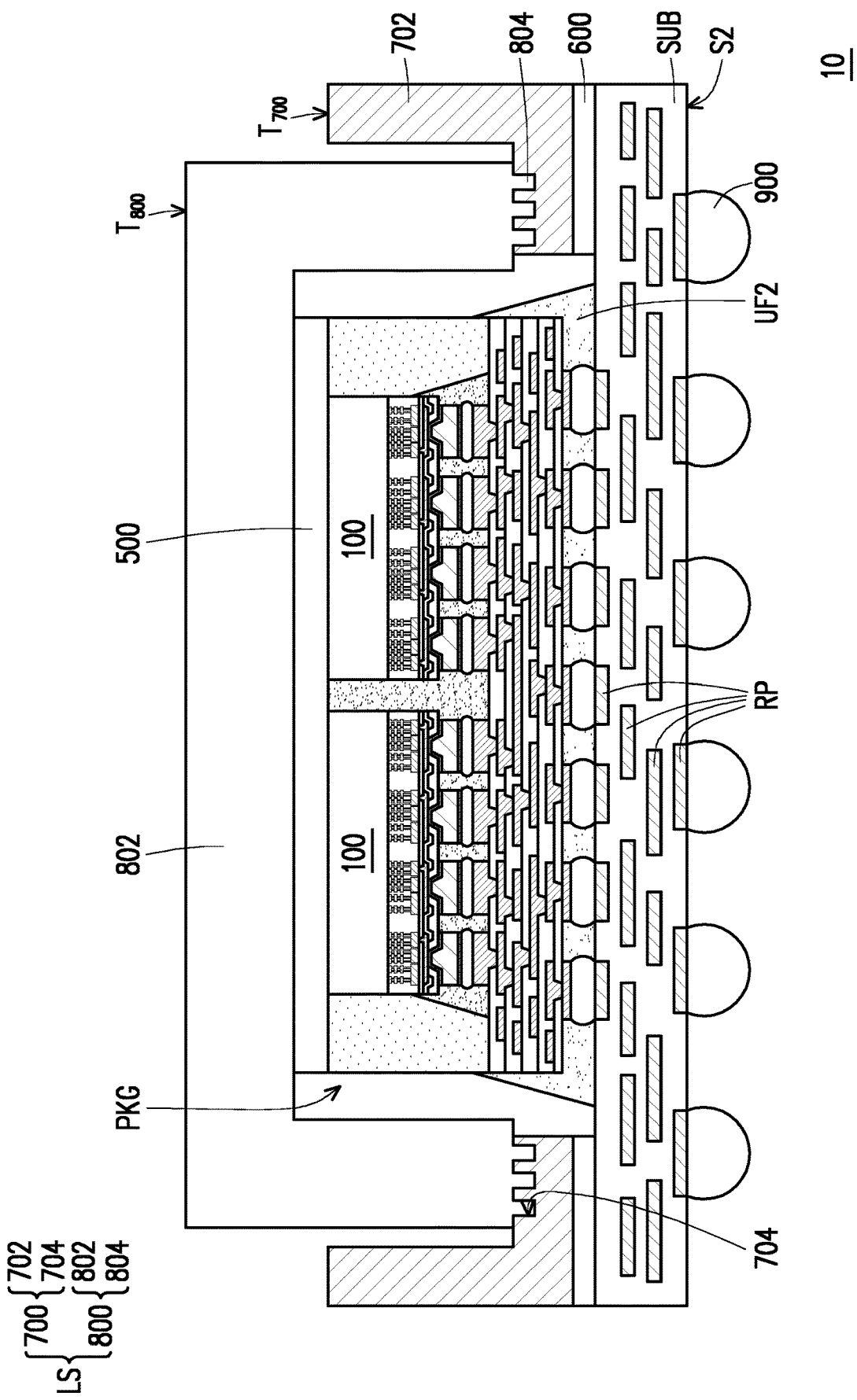

Referring to FIG. 3F, a plurality of conductive terminals 900 is formed on the second surface S2 of the substrate SUB to obtain the semiconductor device 10. In some embodiments, the conductive terminals 900 are solder balls, ball grid array (BGA) balls, or the like. In some embodiments, the conductive terminals 900 are made of a conductive material with low resistivity, such as Sn, Pb, Ag, Cu, Ni, Bi, or an alloy thereof. In some embodiments, the conductive terminals 900 are in physical contact with the routing patterns RP exposed at the second surface S2 of the substrate SUB.

As illustrated in FIG. 3F, a top surface $T_{800}$ of the second heat spreader 800 is located at a level height higher than that of a top surface $T_{700}$ of the first heat spreader 700. However, it should be understood that FIG. 3F merely illustrates one of the cross-sectional views of the semiconductor device 100 and does not represented the shape of the entire first heat spreader 700. The shape of the first heat spreader 700 will be discussed below in conjunction with FIG. 3F, FIG. 4, and FIG. 5.

Figure 4:
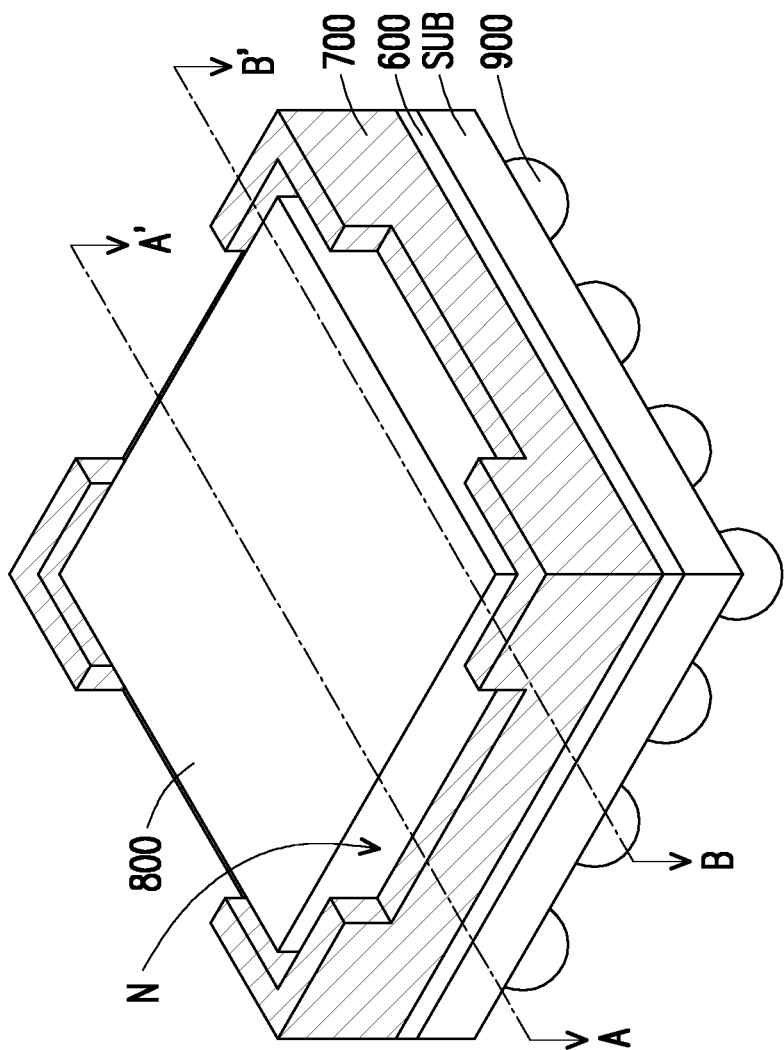
FIG. 4 is a schematic perspective view of the semiconductor device in FIG. 3F.
Figure 5:
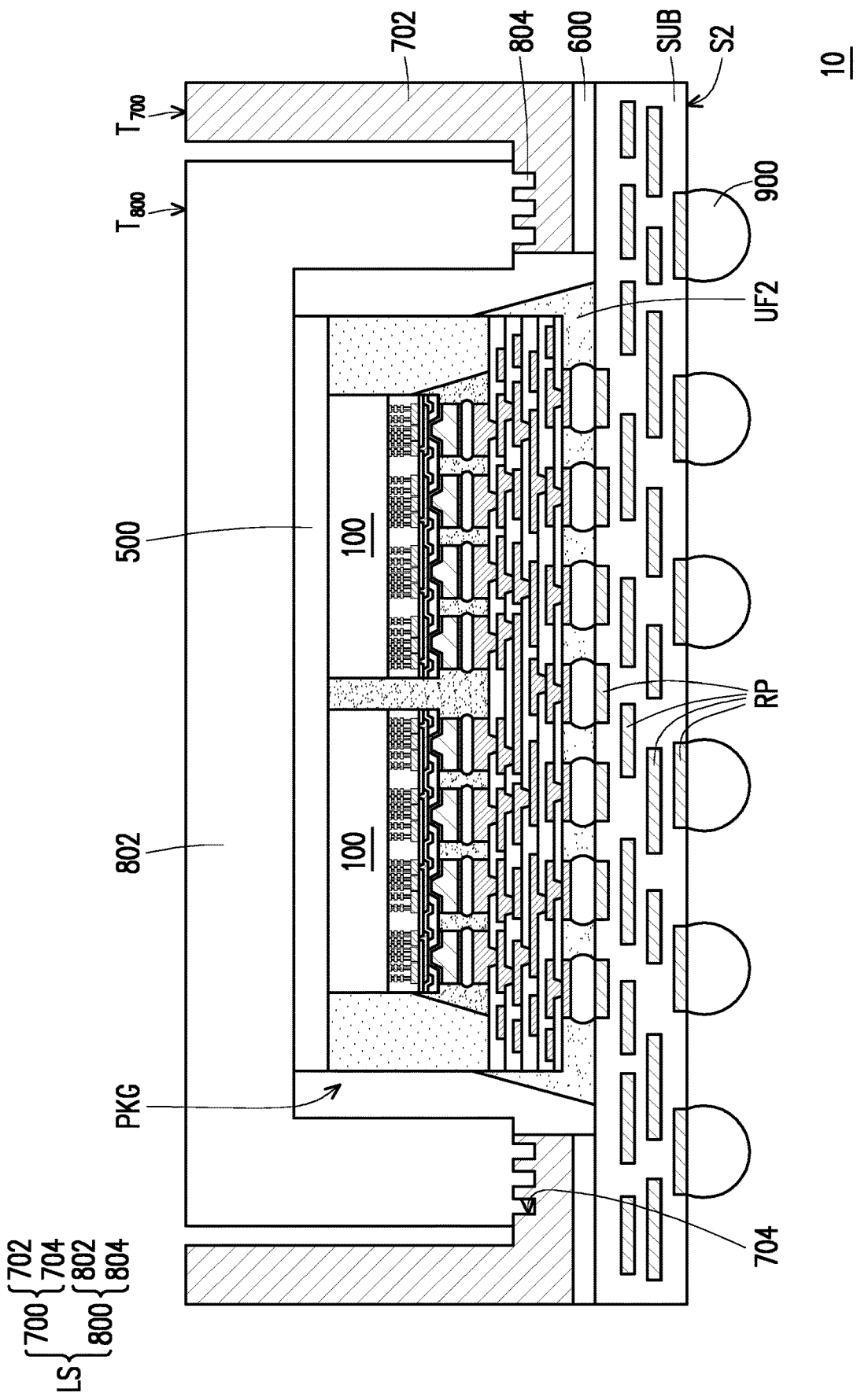
FIG. 5 is a schematic cross-sectional view of the semiconductor device in FIG. 4.

FIG. 4 is a schematic perspective view of the semiconductor device 10 in FIG. 3F. FIG. 5 is a schematic cross-sectional view of the semiconductor device 10 in FIG. 4. Please be noted that the cross-sectional view of the semiconductor device 10 shown in FIG. 3F is taken along line A-A' in FIG. 4, and the cross-sectional view of the semiconductor device 10 shown in FIG. 5 is taken along line B-B' in FIG. 4. Referring to FIG. 3F, FIG. 4, and FIG. 5, the first heat spreader 700 has a plurality of notches N. In some embodiments, the notches N are located at the middle portions of the edges of the semiconductor device 10. In other words, a height of the first heat spreader 700 at four corners of the semiconductor device 10 is larger than a height of the first heat spreader 700 at the middle portion of the edges of the semiconductor device 10. For example, as illustrated in FIG. 3F, at the middle portion of the edges of the semiconductor device 10, the top surface $T_{800}$ of the second heat spreader 800 is located at a level height higher than that of the top surface $T_{700}$ of the first heat spreader 700. On the other hand, as illustrated in FIG. 5, at the corners of the semiconductor device 10, the top surface $T_{800}$ of the second heat spreader 800 and the top surface $T_{700}$ of the first heat spreader 700 are substantially located at a same level height.

In some embodiments, the lid structure LS serves the function of heat dissipation. In other words, the heat generated during operation of the semiconductor dies 100 may be dissipated through the path created by the lid structure LS. In some embodiments, during the manufacturing process the semiconductor device 10, especially high temperature thermal processes, delamination may occur between components of the semiconductor device 10 due to CTE mismatch between two different materials. However, as mentioned above, the lid structure LS includes the first heat spreader 700 and the second heat spreader 800 with different CTEs and different Young's modulus. By adopting the first heat spreader 700 and the second heat spreader 800 with different CTEs and different Young's modulus, the stress exerted during the thermal processes may be sufficiently reduced or compensated. As such, the delamination between the elements within the semiconductor device 10 may be sufficiently eliminated.

Figure 6:
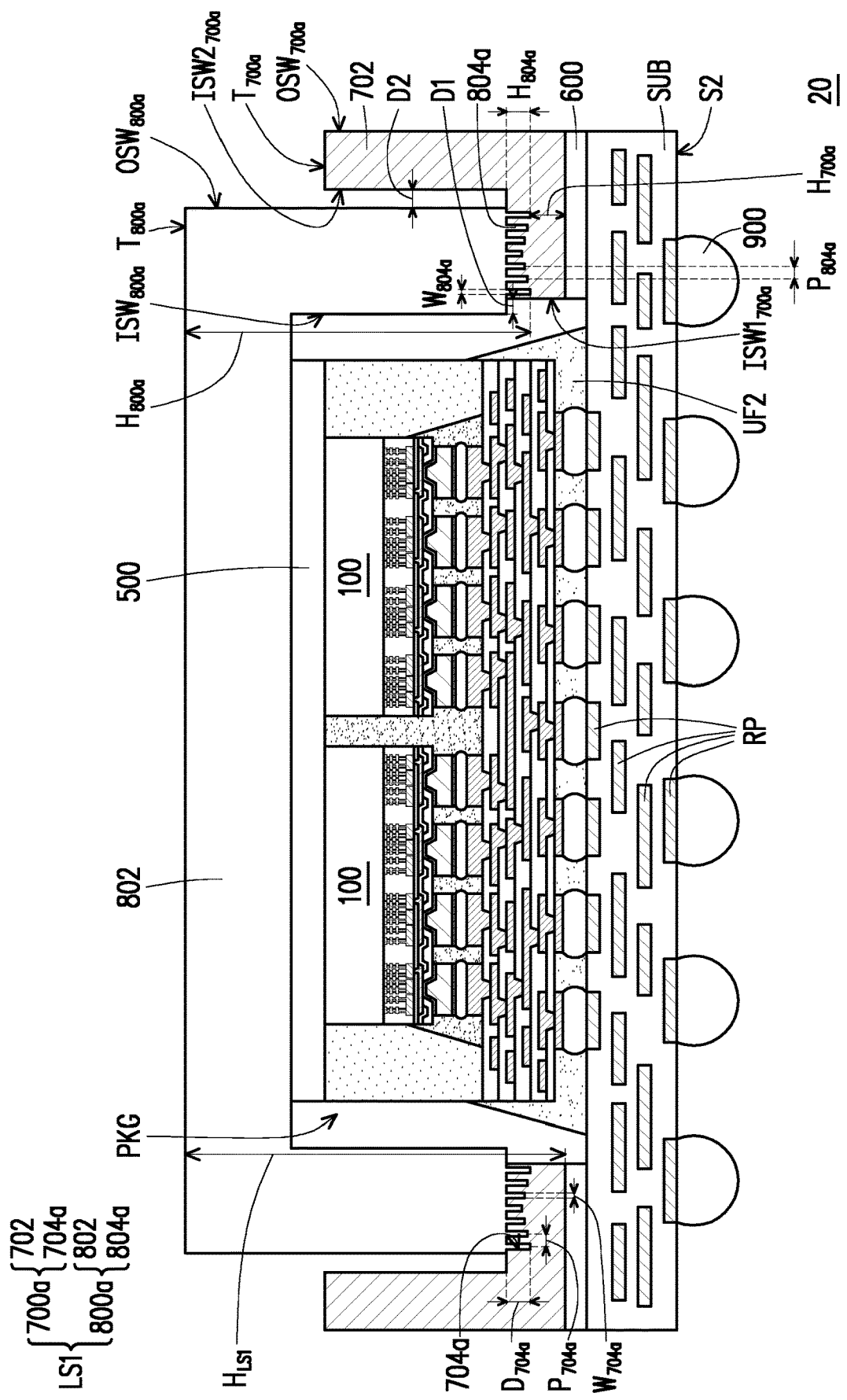
FIG. 6 is a schematic cross-sectional view illustrating a semiconductor device in accordance with some alternative embodiments of the disclosure.

FIG. 6 is a schematic cross-sectional view illustrating a semiconductor device 20 in accordance with some alternative embodiments of the disclosure. Referring to FIG. 6, the semiconductor device 20 in FIG. 6 is similar to the semiconductor device 10 in FIG. 3F, so similar elements are denoted by the same reference numerals, and the detailed descriptions thereof are omitted herein. However, the lid structure LS in FIG. 3F is replaced by the lid structure LS1 in FIG. 6. In some embodiments, the lid structure LS1 includes a first heat spreader 700a and a second heat spreader 800a. The first heat spreader 700a and the second heat spreader 800a in FIG. 6 are respectively similar to the heat spreader 700 and the second heat spreader 800 in FIG. 3D, so the detailed descriptions thereof are omitted herein. However, the first heat spreader 700a includes a plurality of recesses 704a having different depths $D_{704a}$. Moreover, the second heat spreader 800a includes a plurality of protrusions 804a having different heights $H_{704a}$.

As illustrated in the cross-sectional view of FIG. 6, the body portion 702 exhibits an L shape, and the recesses 704a are formed on the L-shaped base. In some embodiments, each recess 704a exhibits a ring shape from a top view. In other words, the recesses 704a are concentric rings from the top view. In some embodiments, the recesses 704a are formed by removing a portion of the body portion 702 through etching, cutting, drilling, or the like. As illustrated in FIG. 6, the body portion 802 exhibit an upside down U shape, and the protrusions 804a are formed on the legs of the upside down U. In some embodiments, the protrusions 804a and the body portion 802 of the second heat spreader 800 are integrally formed. For example, the protrusions 804a may be formed by removing a portion of the body portion 802 through etching, cutting, drilling, or the like. In some embodiments, each protrusion 804a exhibits a ring shape from a bottom view. In other words, the protrusion 804a are concentric rings from the bottom view.

Referring to FIG. 6, the lid structure LS1 has a height $H_{LS1}$ ranging from about 3.45 mm to about 5.0 mm. In some embodiments, the first heat spreader 700a has a minimum height $H_{700a}$ ranging from about 0.75 mm to about 2.45 mm. Meanwhile, the second heat spreader 800a has a maximum height $H_{800a}$ ranging from about 1 mm to about 2.7 mm. As mentioned above, the recesses 704a have different depths $D_{704a}$. The depths $D_{704a}$ of these recesses 704a may be in a range of greater than 0 μm and less than 1500 μm. On the other hand, a width $W_{704a}$ of each recess 704a is in a range of greater than 0 μm and less than 1000 μm. As illustrated in FIG. 6, each recess 704a of the first heat spreader 700a has substantially the same width $W_{704a}$. In some embodiments, a pitch $P_{704a}$ between two adjacent recesses 704a (i.e. a distance between centers of the two adjacent recesses 704a) is in a range of greater than 0 μm and less than 2500 μm. As mentioned above, the protrusions 804a have different heights $H_{804a}$. The heights $H_{804a}$ of these protrusions 804a may be in a range of greater than 0 μm and less than 1500 μm. On the other hand, a width $W_{804a}$ of each protrusion 804a is in a range of greater than 0 μm and less than 1000 μm. As illustrated in FIG. 6, each protrusion 804a of the second heat spreader 800a has substantially the same width $W_{804_a}$. In some embodiments, a pitch $P_{804_a}$ between two adjacent protrusions 804a (i.e. a distance between centers of the two adjacent protrusions 804a) is in a range of greater than 0 μm and less than 2500 μm.

In some embodiments, the recesses 704a of the first heat spreader 700a and the corresponding protrusions 804a of the second heat spreader 800a are perfect fit. In other words, the width $W_{804_a}$ of each protrusion 804a of the second heat spreader 800a is substantially the same as the width $W_{704_a}$ of the corresponding recess 704a of the first heat spreader 700a, and the height $H_{804_a}$ of each protrusion 804a of the second heat spreader 800a is substantially the same as the depth $D_{704_a}$ of the corresponding recess 704a of the first heat spreader 700a. That is, a shape of each protrusion 804a of the second heat spreader 800a is substantially identical to a shape of the corresponding recess 704a of the first heat spreader 700a. As such, the protrusions 804a of the second heat spreader 800a are securely fitted into the recesses 704a of the first heat spreader 700a without the presence of any adhesive material. For example, the protrusions 804a of the second heat spreader 800a are being wrapped around and being securely fixed by the body portion 702 of the first heat spreader 700a. In other words, the first heat spreader 700a is in physical contact with the second heat spreader 800a. As such, the lid structure LS1 is considered to have a fool-proof design for assembly.

It should be noted that in some alternative embodiments, the protrusions 804a of the second heat spreader 800a and the recesses 704a of the first heat spreader 700a may not be in perfect fit. For example, in some alternative embodiments, the width $W_{804_a}$ of each protrusion 804a of the second heat spreader 800a is substantially the same as the width $W_{704_a}$ of the corresponding recess 704a of the first heat spreader 700a, but the height $H_{804_a}$ of each protrusion 804a of the second heat spreader 800a is different from the depth $D_{704_a}$ of the corresponding recess 704a of the first heat spreader 700a. Although the height $H_{804_a}$ of the protrusions 804a is different from the depth $D_{704_a}$ of the recesses 704a, due to the same widths (i.e. the width $W_{804_a}$ of the protrusions 804a is substantially the same as the width $W_{704_a}$ of the recesses 704a), the protrusions 804a can still be securely engaged into the recesses 704a without the presence of any adhesive material.

As mentioned above, the first heat spreader 700a exhibits an L shape from the cross-sectional view. As such, the first heat spreader 700a has a first inner sidewall $ISW1_{700_a}$ and a second inner sidewall $ISW2_{700_a}$, as illustrated in FIG. 6. Meanwhile, the first heat spreader 700a has one outer sidewall $OSW_{700_a}$ opposite to the first inner sidewall $ISW1_{700_a}$ and the second inner sidewall $ISW2_{700_a}$. In some embodiments, the second heat spreader 800a has an inner sidewall $ISW_{800_a}$ and an outer sidewall $OSW_{800_a}$ opposite to the inner sidewall $ISW_{800_a}$. As illustrated in FIG. 6, the first inner sidewall $ISW1_{700_a}$ of the first heat spreader 700a and the inner sidewall $ISW_{800_a}$ of the second heat spreader 800a has an offset. For example, a distance D1 of about 200 μm to about 500 μm is found between the first inner sidewall $ISW1_{700_a}$ of the first heat spreader 700a and the inner sidewall $ISW_{800_a}$ of the second heat spreader 800a. As illustrated in FIG. 6, the outer sidewalls $OSW_{800_a}$ of the second heat spreader 800a is spaced apart from the second inner sidewall $ISW2_{700_a}$ of the first heat spreader 700a. For example, a distance D2 of about 200 μm to about 500 μm is found between the outer sidewalls $OSW_{800_a}$ of the second heat spreader 800a and the second inner sidewall $ISW2_{700_a}$ of the first heat spreader 700a.

As illustrated in FIG. 6, the height $H_{804_a}$ of the protrusions 804 that are closer to the inner sidewall $ISW_{800_a}$ and the outer sidewall $OSW_{800_a}$ of the second heat spreader 800a is larger than the height $H_{804_a}$ of the protrusions 804 that are further away from the inner sidewall $ISW_{800_a}$ and the outer sidewall $OSW_{800_a}$ of the second heat spreader 800a. In other words, the height $H_{804_a}$ of the protrusions 804a gradually increases toward the inner sidewall $ISW_{800_a}$ and the outer sidewall $OSW_{800_a}$ of the second heat spreader 800a. However, the disclosure is not limited thereto. In some embodiments, the height $H_{804_a}$ of the protrusions 804a may gradually decrease toward the inner sidewall $ISW_{800_a}$ and the outer sidewall $OSW_{800_a}$ of the second heat spreader 800a.

As illustrated in the cross-sectional view of FIG. 6, the top surface $T_{800_a}$ of the second heat spreader 800a is located at a level height higher than that of the top surface $T_{700_a}$ of the first heat spreader 700a in the semiconductor device 20. However, similar to that of the semiconductor device 10, in some other cross-sectional views of the semiconductor device 20, the top surface $T_{800_a}$ of the second heat spreader 800a and the top surface $T_{700_a}$ of the first heat spreader 700a are substantially located at a same level height.

In some embodiments, the lid structure LS1 serves the function of heat dissipation. In other words, the heat generated during operation of the semiconductor dies 100 may be dissipated through the path created by the lid structure LS1. In some embodiments, during the manufacturing process the semiconductor device 20, especially high temperature thermal processes, delamination may occur between components of the semiconductor device 20 due to CTE mismatch between two different materials. However, as mentioned above, the lid structure LS1 includes the first heat spreader 700a and the second heat spreader 800a with different CTEs and different Young's modulus. By adopting the first heat spreader 700a and the second heat spreader 800a with different CTEs and Young's modulus, the stress exerted during the thermal processes may be sufficiently reduced or compensated. As such, the delamination between the elements within the semiconductor device 20 may be sufficiently eliminated.

Figure 7:
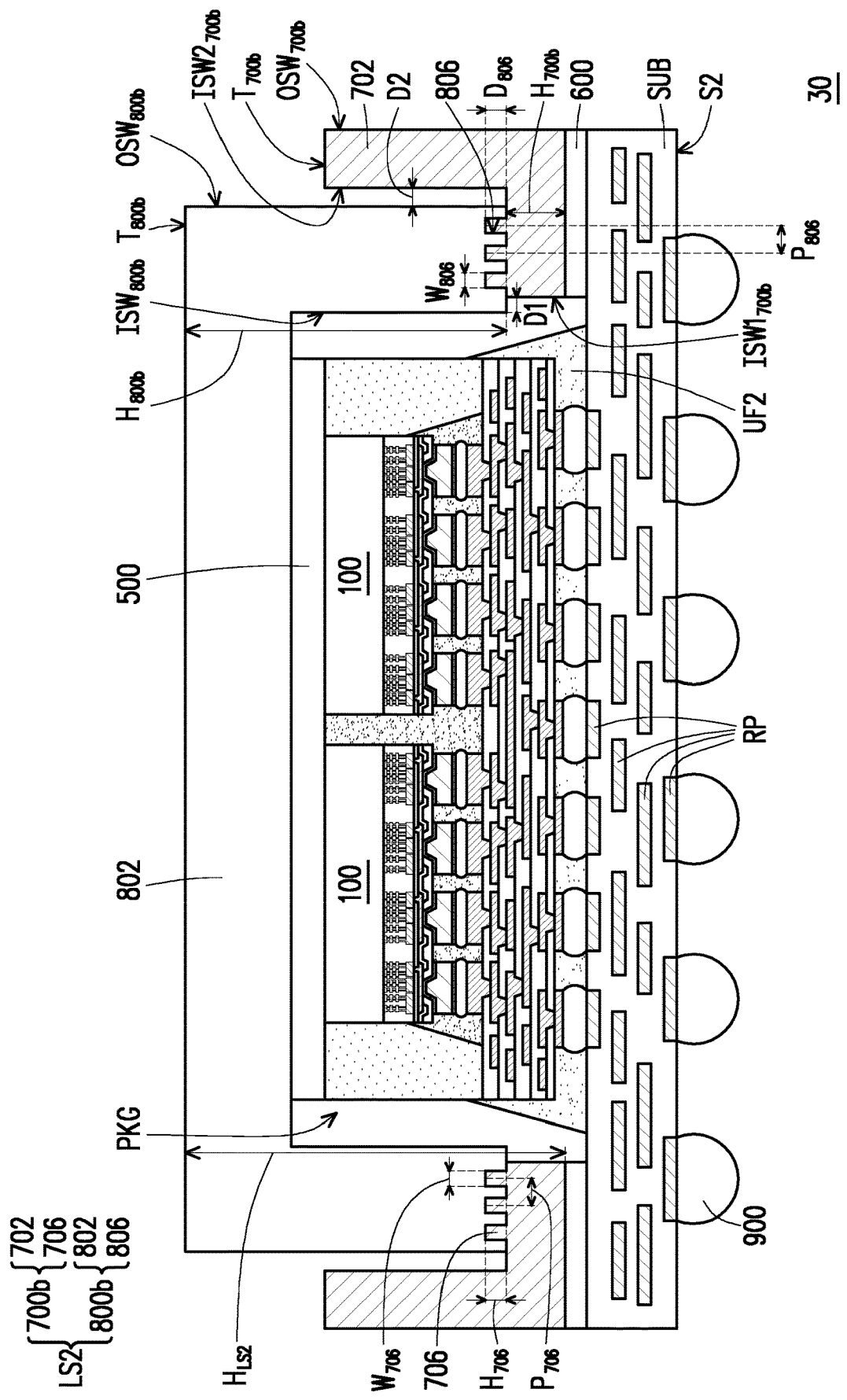
FIG. 7 is a schematic cross-sectional view illustrating a semiconductor device in accordance with some alternative embodiments of the disclosure.

FIG. 7 is a schematic cross-sectional view illustrating a semiconductor device 30 in accordance with some alternative embodiments of the disclosure. Referring to FIG. 7, the semiconductor device 30 in FIG. 7 is similar to the semiconductor device 10 in FIG. 3F, so similar elements are denoted by the same reference numerals, and the detailed descriptions thereof are omitted herein. However, the lid structure LS in FIG. 3F is replaced by the lid structure LS2 in FIG. 7. In some embodiments, the lid structure LS2 includes a first heat spreader 700b and a second heat spreader 800b. In some embodiments, a material of the first heat spreader 700b and a material of the second heat spreader 800b in FIG. 7 are respectively similar to those of the heat spreader 700 and the second heat spreader 800 in FIG. 3C, so the detailed descriptions thereof are omitted herein.

In some embodiments, the first heat spreader 700b includes a body portion 702 and a plurality of protrusions 706 protruding from a top surface of the body portion 702. As illustrated in the cross-sectional view of FIG. 7, the body portion 702 exhibits an L shape, and the protrusions 706 are formed on the L-shaped base. In some embodiments, each protrusion 706 exhibits a ring shape from a top view. In other words, the protrusions 706 are concentric rings from the top view. In some embodiments, the protrusions 706 and the body portion 702 of the first heat spreader 700b are integrally formed. For example, the protrusions 706 may be formed by removing a portion of the body portion 702 through etching, cutting, drilling, or the like. In some embodiments, the second heat spreader 800b includes a body portion 802 and a plurality of recesses 806 recessing from a bottom surface of the body portion 802. As illustrated in the cross-sectional view of FIG. 7, the body portion 802 exhibit an upside down U shape, and the recesses 806 are formed on the legs of the upside down U. In some embodiments, each recess 806 exhibits a ring shape from a bottom view. In other words, the recesses 806 are concentric rings from the bottom view. In some embodiments, the recesses 806 are formed by removing a portion of the body portion 802 through etching, cutting, drilling, or the like. In some embodiments, the first heat spreader 700b and the second heat spreader 800b are assembled by engaging the protrusions 706 of the first heat spreader 700b to the recesses 806 of the second heat spreader 800b, as illustrated in FIG. 7.

In some embodiments, the lid structure LS2 has a height $H_{LS2}$ ranging from about 3.45 mm to about 5.0 mm. In some embodiments, the first heat spreader 700b has a minimum height $H_{700b}$ ranging from about 0.75 mm to about 2.45 mm. Meanwhile, the second heat spreader 800b has a maximum height $H_{800b}$ ranging from about 1 mm to about 2.7 mm. In some embodiments, a height $H_{706}$ of each protrusion 706 is in a range of greater than 0 μm and less than 1500 μm. On the other hand, a width $W_{706}$ of each protrusion 706 is in a range of greater than 0 μm and less than 1000 μm. As illustrated in FIG. 7, each protrusion 706 of the first heat spreader 700b has substantially the same height $H_{706}$. Moreover, each protrusion 706 of the first heat spreader 700b may have substantially the same width $W_{706}$. In some embodiments, a pitch $P_{706}$ between two adjacent protrusions 706 (i.e. a distance between centers of the two adjacent protrusions 706) is in a range of greater than 0 μm and less than 2500 μm. In some embodiments, a depth $D_{806}$ of each recess 806 is in a range of greater than 0 μm and less than 1500 μm. On the other hand, a width $W_{806}$ of each recess 806 is in a range of greater than 0 μm and less than 1000 μm. As illustrated in FIG. 7, each recess 806 of the second heat spreader 800b has substantially the same depth $D_{806}$. Moreover, each recess 806 of the second heat spreader 800b may have substantially the same width $W_{806}$. In some embodiments, a pitch $P_{806}$ between two adjacent recesses 806 (i.e. a distance between centers of the two adjacent recesses 806) is in a range of greater than 0 μm and less than 2500 μm.

In some embodiments, the protrusions 706 of the first heat spreader 700b and the corresponding recesses 806 of the second heat spreader 800b are perfect fit. In other words, the width $W_{706}$ of each protrusion 706 of the first heat spreader 700b is substantially the same as the width $W_{806}$ of the corresponding recess 806 of the second heat spreader 800b, and the height $H_{706}$ of each protrusion 706 of the first heat spreader 700b is substantially the same as the depth $D_{806}$ of the corresponding recess 806 of the second heat spreader 800b. That is, a shape of each protrusion 706 of the first heat spreader 700b is substantially identical to a shape of the corresponding recess 806 of the second heat spreader 800b. As such, the protrusions 706 of the first heat spreader 700b are securely fitted into the recesses 806 of the second heat spreader 800b without the presence of any adhesive material. For example, the protrusions 706 of the first heat spreader 700b are being wrapped around and being securely fixed by the body portion 802 of the second heat spreader 800b. In other words, the first heat spreader 700b is in physical contact with the second heat spreader 800b. As such, the lid structure LS2 is considered to have a fool-proof design for assembly.

It should be noted that in some alternative embodiments, the protrusions 706 of the first heat spreader 700b and the recesses 806 of the second heat spreader 800b may not be in perfect fit. For example, in some alternative embodiments, the width $W_{706}$ of each protrusion 706 of the first heat spreader 700b is substantially the same as the width $W_{806}$ of the corresponding recess 806 of the second heat spreader 800b, but the height $H_{706}$ of each protrusion 706 of the first heat spreader 700b is different from the depth $D_{806}$ of the corresponding recess 806 of the second heat spreader 800b. Although the height $H_{706}$ of the protrusions 706 is different from the depth $D_{806}$ of the recesses 806, due to the same widths (i.e. the width $W_{706}$ of the protrusions 706 is substantially the same as the width $W_{806}$ of the recesses 806), the protrusions 706 can still be securely engaged to the recesses 806 without the presence of any adhesive material.

As mentioned above, the first heat spreader 700b exhibits an L shape from the cross-sectional view. As such, the first heat spreader 700b has a first inner sidewall $ISW1_{700b}$ and a second inner sidewall $ISW2_{700b}$, as illustrated in FIG. 7. Meanwhile, the first heat spreader 700b has one outer sidewall $OSW_{700b}$ opposite to the first inner sidewall $ISW1_{700b}$ and the second inner sidewall $ISW2_{700}$b. In some embodiments, the second heat spreader 800b has an inner sidewall $ISW_{800b}$ and an outer sidewall $OSW_{800b}$ opposite to the inner sidewall $ISW_{800b}$. As illustrated in FIG. 7, the first inner sidewall $ISW1_{700b}$ of the first heat spreader 700b and the inner sidewall $ISW_{800b}$ of the second heat spreader 800b has an offset. For example, a distance D1 of about 200 μm to about 500 μm is found between the first inner sidewall $ISW1_{700b}$ of the first heat spreader 700b and the inner sidewall $ISW_{800b}$ of the second heat spreader 800b. As illustrated in FIG. 7, the outer sidewalls $OSW_{800b}$ of the second heat spreader 800b is spaced apart from the second inner sidewall $ISW2_{700b}$ of the first heat spreader 700b. For example, a distance D2 of about 200 μm to about 500 μm is found between the outer sidewalls $OSW_{800b}$ of the second heat spreader 800b and the second inner sidewall $ISW2_{700b}$ of the first heat spreader 700b.

As illustrated in the cross-sectional view of FIG. 7, the top surface $T_{800b}$ of the second heat spreader 800b is located at a level height higher than that of the top surface $T_{700b}$ of the first heat spreader 700b in the semiconductor device 30. However, similar to that of the semiconductor device 10, in some other cross-sectional views of the semiconductor device 30, the top surface $T_{800b}$ of the second heat spreader 800b and the top surface $T_{700b}$ of the first heat spreader 700b are substantially located at a same level height.

In some embodiments, the lid structure LS2 serves the function of heat dissipation. In other words, the heat generated during operation of the semiconductor dies 100 may be dissipated through the path created by the lid structure LS2. In some embodiments, during the manufacturing process the semiconductor device 30, especially high temperature thermal processes, delamination may occur between components of the semiconductor device 30 due to CTE mismatch between two different materials. However, as mentioned above, the lid structure LS2 includes the first heat spreader 700b and the second heat spreader 800b with different CTEs and different Young's modulus. By adopting the first heat spreader 700b and the second heat spreader 800b with different CTEs and Young's modulus, the stress exerted during the thermal processes may be sufficiently reduced or compensated. As such, the delamination between the elements within the semiconductor device 30 may be sufficiently eliminated.

Figure 8:
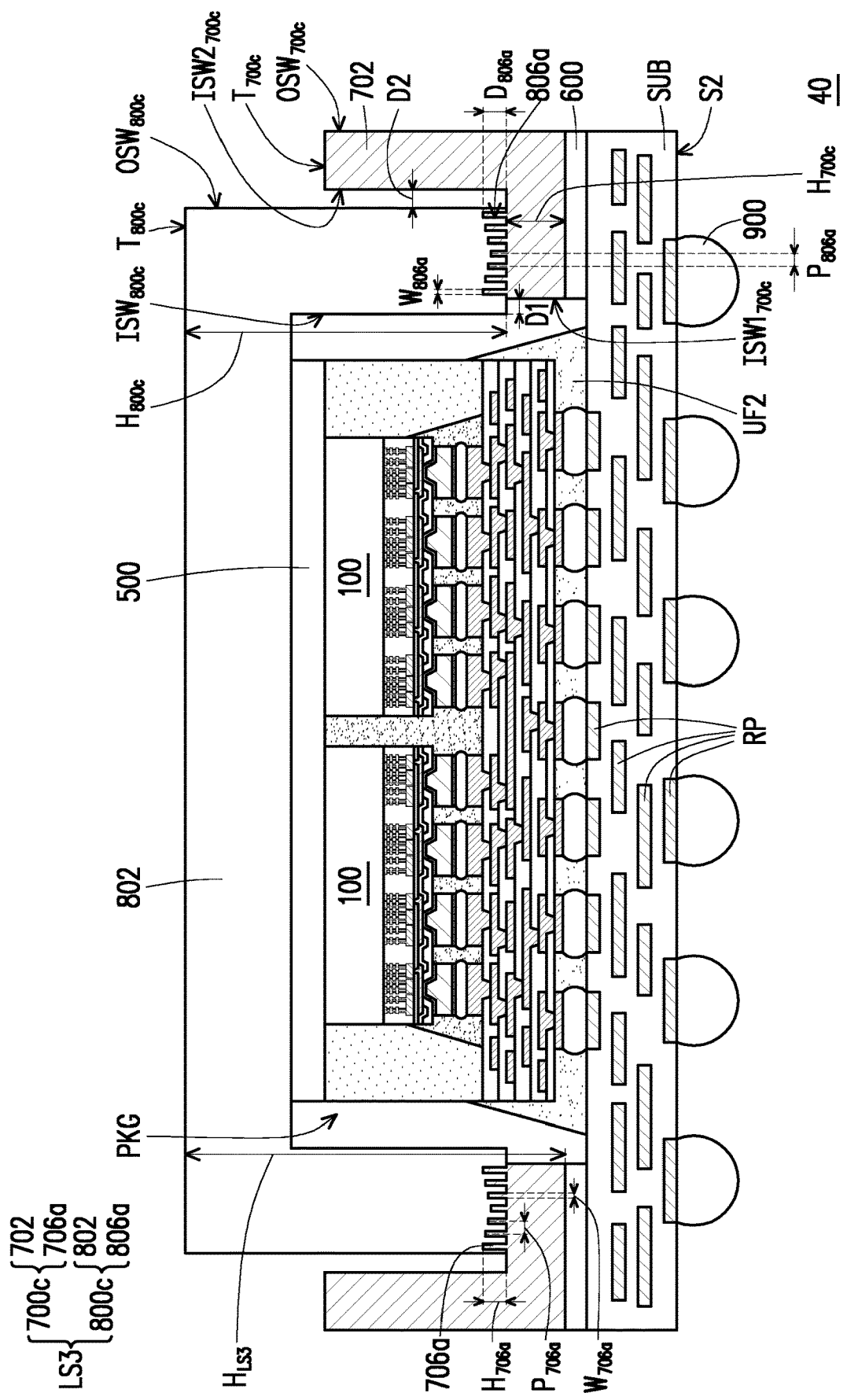
FIG. 8 is a schematic cross-sectional view illustrating a semiconductor device in accordance with some alternative embodiments of the disclosure.

FIG. 8 is a schematic cross-sectional view illustrating a semiconductor device 40 in accordance with some alternative embodiments of the disclosure. Referring to FIG. 8, the semiconductor device 40 in FIG. 8 is similar to the semiconductor device 30 in FIG. 7, so similar elements are denoted by the same reference numerals, and the detailed descriptions thereof are omitted herein. However, the lid structure LS2 in FIG. 7 is replaced by the lid structure LS3 in FIG. 8. In some embodiments, the lid structure LS3 includes a first heat spreader 700c and a second heat spreader 800c. The first heat spreader 700c and the second heat spreader 800c in FIG. 8 are respectively similar to the heat spreader 700b and the second heat spreader 800b in FIG. 7, so the detailed descriptions thereof are omitted herein. However, the first heat spreader 700c includes a plurality of protrusions 706a having different heights $H_{706a}$. Moreover, the second heat spreader 800c includes a plurality of recesses 806a having different depths $D_{806a}$.

As illustrated in the cross-sectional view of FIG. 8, the body portion 702 exhibits an L shape, and the protrusions 706a are formed on the L-shaped base. In some embodiments, each protrusion 706a exhibits a ring shape from a top view. In other words, the protrusions 706a are concentric rings from the top view. In some embodiments, the protrusions 706a and the body portion 702 of the first heat spreader 700c are integrally formed. For example, the protrusions 706a may be formed by removing a portion of the body portion 702 through etching, cutting, drilling, or the like. As illustrated in the cross-sectional view of FIG. 8, the body portion 802 exhibits an upside down U shape, and the recesses 806a are formed on the legs of the upside U. In some embodiments, each recess 806a exhibits a ring shape from a bottom view. In other words, the recesses 806a are concentric rings from the bottom view. In some embodiments, the recesses 806a are formed by removing a portion of the body portion 802 through etching, cutting, drilling, or the like.

Referring to FIG. 8, the lid structure LS3 has a height $H_LS3$ ranging from about 3.45 mm to about 5.0 mm. In some embodiments, the first heat spreader 700c has a minimum height $H_{700c}$ ranging from about 0.75 mm to about 2.45 mm. Meanwhile, the second heat spreader 800c has a maximum height $H_{800c}$ ranging from about 1 mm to about 2.7 mm. As mentioned above, the protrusions 706a have different heights $H_{706a}$. The heights $H_{706a}$ of these protrusions 706 may be in a range of greater than 0 μm and less than 1500 μm. On the other hand, a width $W_{706a}$ of each protrusion 706a is in a range of greater than 0 μm and less than 1000 μm. As illustrated in FIG. 8, each protrusion 706a of the first heat spreader 700c has substantially the same width $W_{706a}$. In some embodiments, a pitch $P_{706a}$ between two adjacent protrusions 706a (i.e. a distance between centers of the two adjacent protrusions 706a) is in a range of greater than 0 μm and less than 2500 μm. As mentioned above, the recesses 806a have different depths $D_{806a}$. The depths $D_{806a}$ of these recesses 806a may be in a range of greater than 0 μm and less than 1500 μm. On the other hand, a width $W_{806a}$ of each recess 806a is in a range of greater than 0 μm and less than 1000 μm. As illustrated in FIG. 8, each recess 806a of the second heat spreader 800c has substantially the same width $W_{806a}$. In some embodiments, a pitch $P_{806a}$ between two adjacent recesses 806a (i.e. a distance between centers of the two adjacent recesses 806a) is in a range of greater than 0 μm and less than 2500 μm.

In some embodiments, the protrusions 706a of the first heat spreader 700c and the corresponding recesses 806a of the second heat spreader 800c are perfect fit. In other words, the width $W_{706a}$ of each protrusion 706a of the first heat spreader 700c is substantially the same as the width $W_{806a}$ of the corresponding recess 806a of the second heat spreader 800c, and the height $H_{706a}$ of each protrusion 706a of the first heat spreader 700c is substantially the same as the depth $D_{806a}$ of the corresponding recess 806a of the second heat spreader 800c. That is, a shape of each protrusion 706a of the first heat spreader 700c is substantially identical to a shape of the corresponding recess 806a of the second heat spreader 800c. As such, the protrusions 706a of the first heat spreader 700c are securely fitted into the recesses 806a of the second heat spreader 800c without the presence of any adhesive material. For example, the protrusions 706a of the first heat spreader 700c are being wrapped around and being securely fixed by the body portion 802 of the second heat spreader 800c. In other words, the first heat spreader 700c is in physical contact with the second heat spreader 800c. As such, the lid structure LS3 is considered to have a fool-proof design for assembly.

It should be noted that in some alternative embodiments, the protrusions 706a of the first heat spreader 700c and the recesses 806a of the second heat spreader 800c may not be in perfect fit. For example, in some alternative embodiments, the width $W_{706a}$ of each protrusion 706a of the first heat spreader 700c is substantially the same as the width $W_{806a}$ of the corresponding recess 806a of the second heat spreader 800c, but the height $H_{706a}$ of each protrusion 706a of the first heat spreader 700c is different from the depth $D_{806a}$ of the corresponding recess 806a of the second heat spreader 800c. Although the height $H_{706a}$ of the protrusions 706a is different from the depth $D_{806a}$ of the recesses 806a, due to the same widths (i.e. the width $W_{706a}$ of the protrusions 706a is substantially the same as the width $W_{806a}$ of the recesses 806a), the protrusions 706a can still be securely engaged to the recesses 806a without the presence of any adhesive material.

As mentioned above, the first heat spreader 700c exhibits an L shape from the cross-sectional view. As such, the first heat spreader 700c has a first inner sidewall $ISW1_{700c}$ and a second inner sidewall $ISW2_{700c}$, as illustrated in FIG. 8. Meanwhile, the first heat spreader 700c has one outer sidewall $OSW_{700c}$ opposite to the first inner sidewall $ISW1_{700c}$ and the second inner sidewall $ISW2_{700c}$. In some embodiments, the second heat spreader 800c has an inner sidewall $ISW_{800c}$ and an outer sidewall $OSW_{800c}$ opposite to the inner sidewall $ISW_{800c}$. As illustrated in FIG. 8, the first inner sidewall $ISW1_{700c}$ of the first heat spreader 700c and the inner sidewall $ISW_{800c}$ of the second heat spreader 800c has an offset. For example, a distance D1 of about 200 μm to about 500 μm is found between the first inner sidewall $ISW1_{700c}$ of the first heat spreader 700c and the inner sidewall $ISW_{800c}$ of the second heat spreader 800c. As illustrated in FIG. 8, the outer sidewalls $OSW_{800c}$ of the second heat spreader 800c is spaced apart from the second inner sidewall $ISW2_{700c}$ of the first heat spreader 700c. For example, a distance D2 of about 200 μm to about 500 μm is found between the outer sidewalls $OSW_{800c}$ of the second heat spreader 800c and the second inner sidewall $ISW2_{700c}$ of the first heat spreader 700c.

As illustrated in FIG. 8, the height $H_{706a}$ of the protrusions 706a that are closer to the inner sidewall $ISW_{800c}$ and the outer sidewall $OSW_{800c}$ of the second heat spreader 800c is larger than the height $H_{706a}$ of the protrusions 706a that are further away from the inner sidewall $ISW_{800c}$ and the outer sidewall $OSW_{800c}$ of the second heat spreader 800c. In other words, the height $H_{706a}$ of the protrusions 706a gradually increases toward the inner sidewall $ISW_{800c}$ and the outer sidewall OSW$_{800c}$ of the second heat spreader 800c. However, the disclosure is not limited thereto. In some embodiments, the height H$_{706a}$ of the protrusions 706a may gradually decrease toward the inner sidewall ISW$_{800c}$ and the outer sidewall OSW$_{800c}$ of the second heat spreader 800c.

As illustrated in the cross-sectional view of FIG. 8, the top surface T$_{800c}$ of the second heat spreader 800c is located at a level height higher than that of the top surface T700c of the first heat spreader 700c in the semiconductor device 40. However, similar to that of the semiconductor device 10, in some other cross-sectional views of the semiconductor device 40, the top surface T$_{800c}$ of the second heat spreader 800c and the top surface T$_{700c}$ of the first heat spreader 700c are substantially located at a same level height.

In some embodiments, the lid structure LS3 serves the function of heat dissipation. In other words, the heat generated during operation of the semiconductor dies 100 may be dissipated through the path created by the lid structure LS3. In some embodiments, during the manufacturing process the semiconductor device 40, especially high temperature thermal processes, delamination may occur between components of the semiconductor device 40 due to CTE mismatch between two different materials. However, as mentioned above, the lid structure LS3 includes the first heat spreader 700c and the second heat spreader 800c with different CTEs and different Young's modulus. By adopting the first heat spreader 700c and the second heat spreader 800c with different CTEs and Young's modulus, the stress exerted during the thermal processes may be sufficiently reduced or compensated. As such, the delamination between the elements within the semiconductor device 40 may be sufficiently eliminated.

Figure 9:
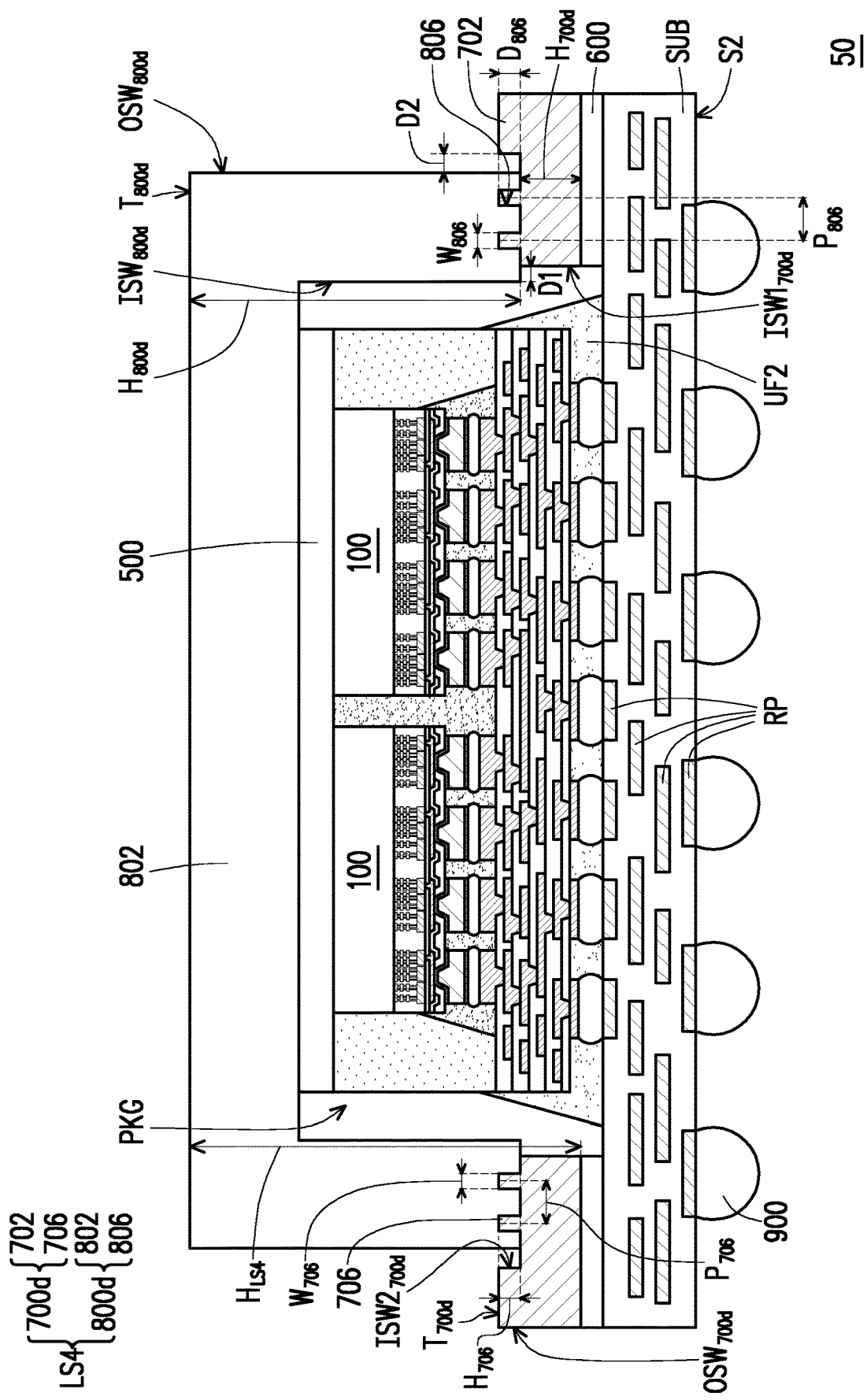
FIG. 9 is a schematic cross-sectional view illustrating a semiconductor device in accordance with some alternative embodiments of the disclosure.

FIG. 9 is a schematic cross-sectional view illustrating a semiconductor device 50 in accordance with some alternative embodiments of the disclosure. Referring to FIG. 9, the semiconductor device 50 in FIG. 9 is similar to the semiconductor device 30 in FIG. 7, so similar elements are denoted by the same reference numerals, and the detailed descriptions thereof are omitted herein. However, the lid structure LS2 in FIG. 7 is replaced by the lid structure LS4 in FIG. 9. In some embodiments, the lid structure LS4 includes a first heat spreader 700d and a second heat spreader 800d. In some embodiments, the first heat spreader 700d and the second heat spreader 800d in FIG. 9 are respectively similar to the first heat spreader 700b and the second heat spreader 800b in FIG. 7, so the detailed descriptions thereof are omitted herein. However, as illustrated in FIG. 9, a top surface of the body portion 702 and top surfaces of the protrusions 706 are substantially coplanar. That is, the top surface of the body portion 702 and the top surfaces of the protrusions 706 are substantially located at the same level height.

In some embodiments, the lid structure LS4 has a height H$_{LS4}$ ranging from about 3.45 mm to about 5.0 mm. In some embodiments, the first heat spreader 700d has a minimum height H$_{700d}$ ranging from about 0.75 mm to about 2.45 mm. Meanwhile, the second heat spreader 800d has a maximum height H$_{800d}$ ranging from about 1 mm to about 2.7 mm. In some embodiments, the first heat spreader 700d exhibits an L shape from the cross-sectional view. As such, the first heat spreader 700d has a first inner sidewall ISW1$_{700d}$ and a second inner sidewall ISW2$_{700d}$, as illustrated in FIG. 9. Meanwhile, the first heat spreader 700d has one outer sidewall OSW$_{700d}$ opposite to the first inner sidewall ISW1$_{700d}$ and the second inner sidewall ISW2$_{700d}$. In some embodiments, the second heat spreader 800d has an inner sidewall ISW$_{800d}$ and an outer sidewall OSW$_{800d}$ opposite to the inner sidewall ISW$_{800d}$. As illustrated in FIG. 9, the first inner sidewall ISW1$_{700d}$ of the first heat spreader 700d and the inner sidewall ISW$_{800d}$ of the second heat spreader 800d has an offset. For example, a distance D1 of about 200 μm to about 500 μm is found between the first inner sidewall ISW1$_{700d}$ of the first heat spreader 700d and the inner sidewall ISW$_{800d}$ of the second heat spreader 800d. As illustrated in FIG. 9, the outer sidewalls OSW$_{800d}$ of the second heat spreader 800d is spaced apart from the second inner sidewall ISW2$_{700d}$ of the first heat spreader 700d. For example, a distance D2 of about 200 μm to about 500 μm is found between the outer sidewalls OSW$_{800d}$ of the second heat spreader 800d and the second inner sidewall ISW2$_{700d}$ of the first heat spreader 700d.

As illustrated in the cross-sectional view of FIG. 9, the top surface T$_{800d}$ of the second heat spreader 800d is located at a level height higher than that of the top surface T$_{700d}$ of the first heat spreader 700d in the semiconductor device 50. However, similar to that of the semiconductor device 10, in some other cross-sectional views of the semiconductor device 50, the top surface T$_{800d}$ of the second heat spreader 800d and the top surface T$_{700d}$ of the first heat spreader 700d are substantially located at a same level height.

In some embodiments, the lid structure LS4 serves the function of heat dissipation. In other words, the heat generated during operation of the semiconductor dies 100 may be dissipated through the path created by the lid structure LS4. In some embodiments, during the manufacturing process the semiconductor device 50, especially high temperature thermal processes, delamination may occur between components of the semiconductor device 50 due to CTE mismatch between two different materials. However, as mentioned above, the lid structure LS4 includes the first heat spreader 700d and the second heat spreader 800d with different CTEs and different Young's modulus. By adopting the first heat spreader 700d and the second heat spreader 800d with different CTEs and Young's modulus, the stress exerted during the thermal processes may be sufficiently reduced or compensated. As such, the delamination between the elements within the semiconductor device 50 may be sufficiently eliminated.

Figure 10:
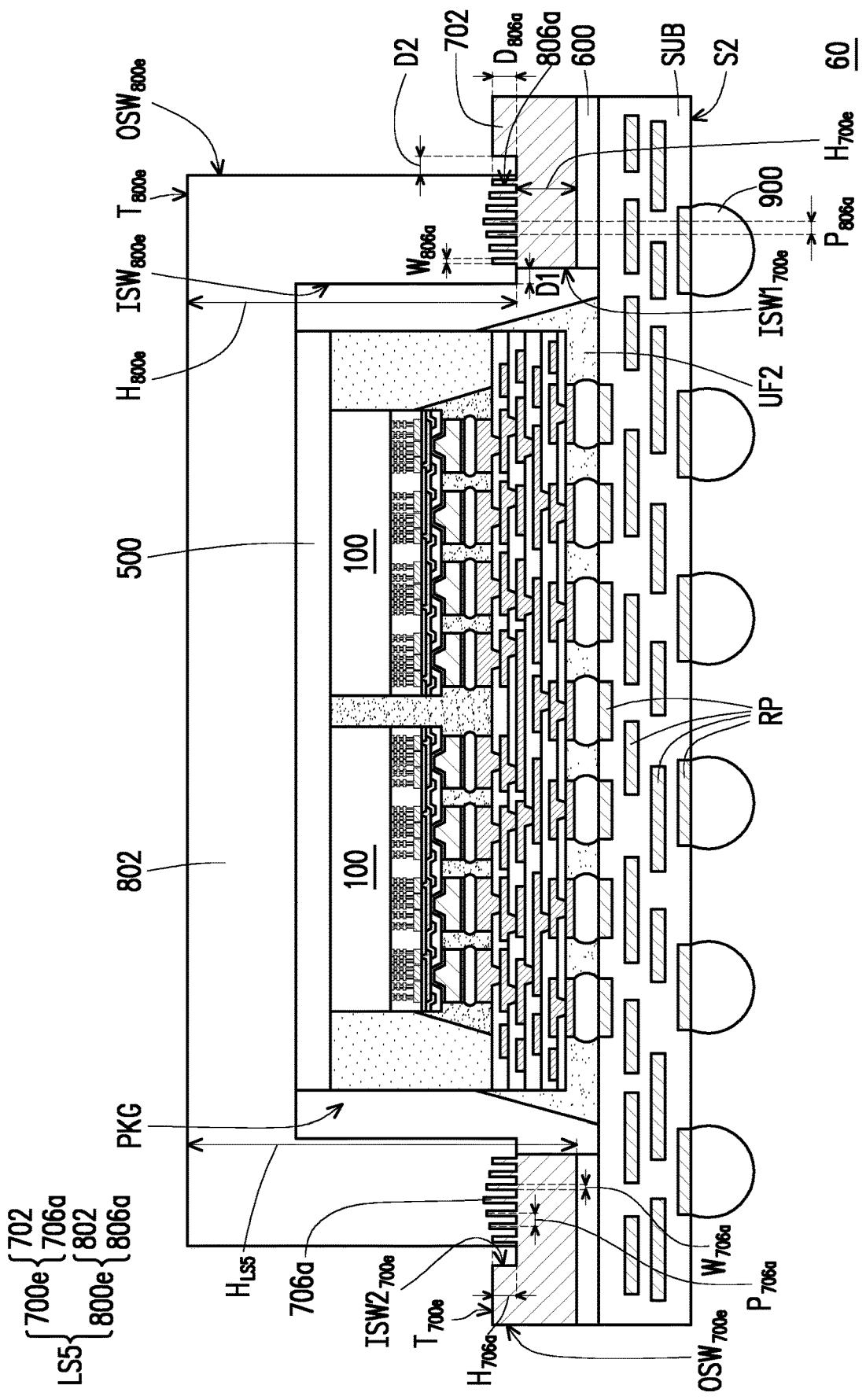
FIG. 10 is a schematic cross-sectional view illustrating a semiconductor device in accordance with some alternative embodiments of the disclosure.

FIG. 10 is a schematic cross-sectional view illustrating a semiconductor device 60 in accordance with some alternative embodiments of the disclosure. Referring to FIG. 10, the semiconductor device 60 in FIG. 10 is similar to the semiconductor device 40 in FIG. 8, so similar elements are denoted by the same reference numerals, and the detailed descriptions thereof are omitted herein. However, the lid structure LS3 in FIG. 8 is replaced by the lid structure LS5 in FIG. 10. In some embodiments, the lid structure LS5 includes a first heat spreader 700e and a second heat spreader 800e. In some embodiments, the first heat spreader 700e and the second heat spreader 800e in FIG. 10 are respectively similar to the first heat spreader 700c and the second heat spreader 800c in FIG. 8, so the detailed descriptions thereof are omitted herein. However, as illustrated in FIG. 10, a top surface of the body portion 702 and top surfaces of the shortest protrusions 706a are substantially coplanar. That is, the top surface of the body portion 702 and the top surfaces of the shortest protrusions 706a are substantially located at the same level height.

In some embodiments, the lid structure LS5 has a height H$_L$S5 ranging from about 3.45 mm to about 5.0 mm. In some embodiments, the first heat spreader 700e has a minimum height H$_{700e}$ ranging from about 0.75 mm to about 2.45 mm. Meanwhile, the second heat spreader 800e has a maximum height H$_{800e}$ ranging from about 1 mm to about 2.7 mm. In some embodiments, the first heat spreader 700e exhibits an L shape from the cross-sectional view. As such, the first heat spreader 700e has a first inner sidewall $ISW1_{700e}$ and a second inner sidewall $ISW2_{700c}$, as illustrated in FIG. 10. Meanwhile, the first heat spreader 700e has one outer sidewall $OSW_{700e}$ opposite to the first inner sidewall $ISW1_{700e}$ and the second inner sidewall $ISW2_{700e}$. In some embodiments, the second heat spreader 800e has an inner sidewall $ISW_{800e}$ and an outer sidewall $OSW_{800e}$ opposite to the inner sidewall $ISW_{800e}$. As illustrated in FIG. 10, the first inner sidewall $ISW1_{700e}$ of the first heat spreader 700e and the inner sidewall $ISW_{800e}$ of the second heat spreader 800e has an offset. For example, a distance D1 of about 200 µm to about 500 µm is found between the first inner sidewall $ISW1_{700e}$ of the first heat spreader 700e and the inner sidewall $ISW_{800e}$ of the second heat spreader 800e. As illustrated in FIG. 10, the outer sidewalls $OSW_{800e}$ of the second heat spreader 800e is spaced apart from the second inner sidewall $ISW2_{700e}$ of the first heat spreader 700e. For example, a distance D2 of about 200 µm to about 500 µm is found between the outer sidewalls $OSW_{800e}$ of the second heat spreader 800e and the second inner sidewall $ISW2_{700e}$ of the first heat spreader 700e.

As illustrated in FIG. 10, the height $H_{706a}$ of the protrusions 706a that are closer to the inner sidewall $ISW_{800e}$ and the outer sidewall $OSW_{800e}$ of the second heat spreader 800e is smaller than the height $H_{706a}$ of the protrusions 706a that are further away from the inner sidewall $ISW_{800e}$ and the outer sidewall $OSW_{800e}$ of the second heat spreader 800e. In other words, the height $H_{706a}$ of the protrusions 706a gradually decreases toward the inner sidewall $ISW_{800e}$ and the outer sidewall $OSW_{800e}$ of the second heat spreader 800e. However, the disclosure is not limited thereto. In some embodiments, the height $H_{706a}$ of the protrusions 706a may gradually increase toward the inner sidewall $ISW_{800e}$ and the outer sidewall $OSW_{800e}$ of the second heat spreader 800e.

As illustrated in the cross-sectional view of FIG. 10, the top surface $T_{800e}$ of the second heat spreader 800e is located at a level height higher than that of the top surface $T_{700e}$ of the first heat spreader 700e in the semiconductor device 60. However, similar to that of the semiconductor device 10, in some other cross-sectional views of the semiconductor device 60, the top surface $T_{800e}$ of the second heat spreader 800e and the top surface $T_{700e}$ of the first heat spreader 700e are substantially located at a same level height.

In some embodiments, the lid structure LS5 serves the function of heat dissipation. In other words, the heat generated during operation of the semiconductor dies 100 may be dissipated through the path created by the lid structure LS5. In some embodiments, during the manufacturing process the semiconductor device 60, especially high temperature thermal processes, delamination may occur between components of the semiconductor device 60 due to CTE mismatch between two different materials. However, as mentioned above, the lid structure LS5 includes the first heat spreader 700e and the second heat spreader 800e with different CTEs and different Young's modulus. By adopting the first heat spreader 700e and the second heat spreader 800e with different CTEs and Young's modulus, the stress exerted during the thermal processes may be sufficiently reduced or compensated. As such, the delamination between the elements within the semiconductor device 60 may be sufficiently eliminated.

In accordance with some embodiments of the disclosure, a semiconductor device includes a substrate, a package structure, a first heat spreader, and a second heat spreader. The package structure is disposed on the substrate. The first heat spreader is disposed on the substrate. The first heat spreader surrounds the package structure. The second heat spreader is disposed on the package structure. The second heat spreader is connected to the first heat spreader. A material of the first heat spreader is different from a material of the second heat spreader.

In accordance with some alternative embodiments of the disclosure, a semiconductor device includes a substrate, a lid structure, and a package structure. The lid structure is disposed on the substrate. The lid structure includes a first heat spreader and a second heat spreader. The first heat spreader is attached to the substrate. The first head spreader includes a first body portion and recesses recessing from a top surface of the first body portion. The second heat spreader includes a second body portion and protrusions protruding from a bottom surface of the second body portion. The protrusions of the second heat spreader are engaged with the recesses of the first heat spreader. The package structure is located between the substrate and the lid structure.

In accordance with some embodiments of the disclosure, a manufacturing method of a semiconductor device includes at least the following steps. A substrate is provided. A package structure is bonded to the substrate. An adhesive layer is applied onto the substrate. A thermal interface material (TIM) layer is applied onto the package structure. A first heat spreader and a second heat spreader are engaged to form a lid structure. The lid structure is attached to the substrate and the package structure through the adhesive layer and the TIM layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a package structure disposed on the substrate;
a first heat spreader disposed on the substrate, wherein the first heat spreader surrounds the package structure, and the first heat spreader is spatially separated from the package structure; and
a second heat spreader disposed on the package structure, wherein the second heat spreader is connected to the first heat spreader, a material of the first heat spreader is different from a material of the second heat spreader, and the second heat spreader laterally surrounds sidewalls of the package structure.

2. The semiconductor device of claim 1, wherein a coefficient of thermal expansion (CTE) and a Young's modulus of the first heat spreader are respectively different from a CTE and a Young's modulus of the second heat spreader.

3. The semiconductor device of claim 1, wherein the second heat spreader is integrally formed, and the first heat spreader is in physical contact with the second heat spreader.

4. The semiconductor device of claim 1, wherein one of the first heat spreader and the second heat spreader comprises protrusions and another one of the first heat spreader and the second heat spreader comprises recesses, and the protrusions are fitted into the recesses.

5. The semiconductor device of claim 1, wherein the first heat spreader at least partially covers outer sidewalls of the second heat spreader, and the first heat spreader is attached to the substrate through an adhesive layer.

6. The semiconductor device of claim 1, wherein the second heat spreader is attached to the package structure through a thermal interface material (TIM) layer.

7. The semiconductor device of claim 1, wherein the package structure comprises:
   an interposer;
   at least one semiconductor die disposed on the interposer; and
   an encapsulant disposed over the interposer to encapsulate the at least one semiconductor die.

8. A semiconductor device, comprising:
   a substrate;
   a lid structure disposed on the substrate, wherein the lid structure comprises:
      a first heat spreader attached to the substrate, wherein the first heat spreader comprises a first body portion and recesses recessing from a top surface of the first body portion;
      a second heat spreader, wherein the second heat spreader comprises a second body portion and protrusions protruding from a bottom surface of the second body portion, and the protrusions of the second heat spreader are engaged with the recesses of the first heat spreader; and
   a package structure located between the substrate and the lid structure, wherein the first heat spreader is spatially separated from the package structure.

9. The semiconductor device of claim 8, wherein each protrusion of the second heat spreader has substantially a same height.

10. The semiconductor device of claim 8, wherein at least two of the protrusions of the second heat spreader have different heights.

11. The semiconductor device of claim 8, wherein each recess of the first heat spreader has substantially a same depth.

12. The semiconductor device of claim 8, wherein at least two of the recesses of the first heat spreader have different depths.

13. The semiconductor device of claim 8, wherein a width of each protrusion of the second heat spreader is substantially the same as a width of the corresponding recess of the first heat spreader.

14. The semiconductor device of claim 13, wherein a height of each protrusion of the second heat spreader is substantially the same as a depth of the corresponding recess of the first heat spreader.

15. The semiconductor device of claim 8, wherein a coefficient of thermal expansion (CTE) and a Young's modulus of the first heat spreader are respectively different from a CTE and a Young's modulus of the second heat spreader.

16. The semiconductor device of claim 8, wherein the package structure comprises:
   an interposer;
   at least one semiconductor die disposed on the interposer; and
   an encapsulant disposed over the interposer to encapsulate the at least one semiconductor die.

17. A manufacturing method of a semiconductor device, comprising:
   providing a substrate;
   bonding a package structure to the substrate;
   applying an adhesive layer onto the substrate;
   applying a thermal interface material (TIM) layer onto the package structure;
   engaging a first heat spreader and a second heat spreader to form a lid structure; and
   attaching the lid structure to the substrate and the package structure through the adhesive layer and the TIM layer, wherein the first heat spreader is spatially separated from the package structure, and the second heat spreader laterally surrounds sidewalls of the package structure.

18. The method of claim 17, wherein the second heat spreader is integrally formed, and a material of the first heat spreader is different from a material of the second heat spreader.

19. The method of claim 17, wherein one of the first heat spreader and the second heat spreader comprises protrusions and another one of the first heat spreader and the second heat spreader comprises recesses, and engaging the first heat spreader and the second heat spreader comprises fitting the protrusions into the recesses.

20. The method of claim 17, wherein the first heat spreader partially covers outer sidewalls of the second heat spreader, and the first heat spreader is attached to the substrate through the adhesive layer and the second heat spreader is attached to the package structure through the TIM layer.

* * * * *